(12) United States Patent
Louie et al.

(10) Patent No.: US 9,281,022 B2
(45) Date of Patent: Mar. 8, 2016

(54) SYSTEMS AND METHODS FOR REDUCING STANDBY POWER IN FLOATING BODY MEMORY DEVICES

(71) Applicant: Zeno Semiconductor, Inc., Cupertino, CA (US)

(72) Inventors: Benjamin S. Louie, Fremont, CA (US); Yuniarto Widjaja, San Jose, CA (US)

(73) Assignee: Zeno Semiconductor, Inc., Cupertino, CA (US)

( * ) Notice: Subject to any disclaimer, the term of this patent is extended or adjusted under 35 U.S.C. 154(b) by 0 days.

(21) Appl. No.: 14/328,633

(22) Filed: Jul. 10, 2014

(65) Prior Publication Data

US 2015/0016207 A1 Jan. 15, 2015

Related U.S. Application Data

(60) Provisional application No. 61/844,832, filed on Jul. 10, 2013, provisional application No. 61/846,720, filed on Jul. 16, 2013.

(51) Int. Cl.
*G11C 16/04* (2006.01)
*G11C 5/14* (2006.01)
*G11C 11/412* (2006.01)

(52) U.S. Cl.
CPC .............. *G11C 5/148* (2013.01); *G11C 11/412* (2013.01)

(58) Field of Classification Search
USPC ............................ 365/185.05, 185.18, 185.08
See application file for complete search history.

(56) References Cited

U.S. PATENT DOCUMENTS

| | | | |
|---|---|---|---|
| 4,300,212 A | 11/1981 | Simko |
| 4,959,812 A | 9/1990 | Momodomi et al. |
| 5,519,831 A | 5/1996 | Holzhammer |
| 5,581,504 A | 12/1996 | Chang et al. |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |
| 6,166,407 A | 12/2000 | Ohta |

(Continued)

OTHER PUBLICATIONS

Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.

(Continued)

*Primary Examiner* — Vu Le
(74) *Attorney, Agent, or Firm* — Alan W. Cannon; Law Office of Alan W. Cannon

(57) ABSTRACT

Methods, devices, arrays and systems for reducing standby power for a floating body memory array. One method includes counting bits of data before data enters the array, wherein the counting includes counting at least one of: a total number of bits at state 1 and a total number of all bits; a total number of bits at state 0 and the total number of all bits; or the total number of bits at state 1 and the total number of bits at state 0. This method further includes detecting whether the total number of bits at state 1 is greater than the total number of bits at state 0; setting an inversion bit when the total number of bits at state 1 is greater than the total number of bits at state 0; and inverting contents of all the bits of data before writing the bits of data to the memory array when the inversion bit has been set.

4 Claims, 17 Drawing Sheets

(56) References Cited

U.S. PATENT DOCUMENTS

| | | |
|---|---|---|
| 6,229,161 B1 | 5/2001 | Nemati et al. |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,653,175 B1 | 11/2003 | Nemati et al. |
| 6,661,042 B2 | 12/2003 | Hsu |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,937,516 B2 | 8/2005 | Fazan et al. |
| 6,954,377 B2 | 10/2005 | Choi et al. |
| 6,956,256 B2 | 10/2005 | Forbes |
| 6,969,662 B2 | 11/2005 | Fazan et al. |
| 7,061,806 B2 | 6/2006 | Tang et al. |
| 7,081,653 B2 | 7/2006 | Kawanaka |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,224,019 B2 | 5/2007 | Hieda et al. |
| 7,224,020 B2 | 5/2007 | Wang et al. |
| 7,259,420 B2 | 8/2007 | Anderson et al. |
| 7,259,992 B2 | 8/2007 | Shirota |
| 7,285,820 B2 | 10/2007 | Park et al. |
| 7,285,832 B2 | 10/2007 | Hoefler et al. |
| 7,301,803 B2 | 11/2007 | Okhonin et al. |
| 7,329,580 B2 | 2/2008 | Choi et al. |
| 7,391,640 B2 | 6/2008 | Tang et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Mathew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,683,430 B2 | 3/2010 | Okhonin |
| 7,701,751 B2 | 4/2010 | Kang et al. |
| 7,701,763 B2 | 4/2010 | Roohparvar |
| 7,733,693 B2 | 6/2010 | Ferrant et al. |
| 7,738,312 B2 | 6/2010 | Shimano et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,898,009 B2 | 3/2011 | Wilson et al. |
| 7,903,472 B2 | 3/2011 | Chen et al. |
| 7,924,630 B2 | 4/2011 | Carman |
| 7,933,140 B2 | 4/2011 | Wang et al. |
| 8,014,200 B2 | 9/2011 | Widjaja |
| 8,018,007 B2 | 9/2011 | Chang et al. |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja et al. |
| 8,243,499 B2 | 8/2012 | Widjaja |
| 8,264,875 B2 | 9/2012 | Widjaja et al. |
| 8,294,193 B2 | 10/2012 | Widjaja |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 2002/0018366 A1 | 2/2002 | Von Schwerin et al. |
| 2002/0048193 A1 | 4/2002 | Tanikawa et al. |
| 2005/0024968 A1 | 2/2005 | Lee et al. |
| 2005/0032313 A1 | 2/2005 | Forbes |
| 2005/0124120 A1 | 6/2005 | Du et al. |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0211535 A1 | 9/2007 | Kim |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0179656 A1 | 7/2008 | Aoki |
| 2008/0224202 A1 | 9/2008 | Young et al. |
| 2008/0265305 A1 | 10/2008 | He et al. |
| 2008/0303079 A1 | 12/2008 | Cho et al. |
| 2009/0016101 A1 | 1/2009 | Okhonin et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0221877 A1 | 9/2010 | Park et al. |
| 2010/0246277 A1* | 9/2010 | Widjaja ............... G11C 11/404 365/189.04 |
| 2010/0246284 A1 | 9/2010 | Widjaja |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |
| 2013/0094280 A1* | 4/2013 | Widjaja ............. G11C 11/4072 365/148 |
| 2013/0148422 A1 | 6/2013 | Widjaja |
| 2013/0250685 A1 | 9/2013 | Widjaja |
| 2013/0264656 A1 | 10/2013 | Widjaja et al. |
| 2013/0292635 A1 | 11/2013 | Widjaja |
| 2013/0301349 A1 | 11/2013 | Widjaja |
| 2014/0021549 A1 | 1/2014 | Widjaja |
| 2014/0036577 A1 | 2/2014 | Widjaja et al. |
| 2014/0159156 A1 | 6/2014 | Widjaja |
| 2014/0160868 A1 | 6/2014 | Widjaja et al. |
| 2014/0198551 A1 | 7/2014 | Louie et al. |

OTHER PUBLICATIONS

Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.

Aoulaiche, et al. "Junction Field Effect on the Retention Time for

(56) References Cited

OTHER PUBLICATIONS

One-Transistor Floating-Body RAM." Electron Devices, IEEE Transactions on, vol. 59, No. 8, 2012, pp. 2167-2172.
Aoulaiche, et al. "Hot hole induced damage in 1T-FBRAM on bulk FinFET." Reliability Physics Symposium (IRPS), 2011 IEEE International. IEEE, 2011, pp. 99-104.
Avci, et al. "Floating-Body Diode—A Novel DRAM Device." Electron Device Letters, IEEE, vol. 33, No. 2, 2012, pp. 161-163.
Bawedin, et al., "Floating-Body SOI Memory: Concepts, Physics, and Challenges", ECS Transactions 19.4 (2009), pp. 243-256.
Ban, et al. "Integration of Back-Gate doping for 15-nm node floating body cell (FBC) memory." VLSI Technology (VLSIT), 2010 Symposium on. IEEE, 2010, pp. 159-160.
Cho, et al. "Variation-aware study of BJT-based capacitorless DRAM cell scaling limit." Silicon Nanoelectronics Workshop (SNW), 2012 IEEE. IEEE, 2012, pp. 1-2.
Cho, et al. "Variation Study and Implications for BJT-Based Thin-Body Capacitorless DRAM." Electron Device Letters, IEEE, vol. 33, No. 3, 2012, pp. 312-314.
Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.
Chiu, et al. "A simple process of thin-film transistor using the trench-oxide layer for improving 1T-DRAM performance." Next-Generation Electronics (ISNE), 2010 International Symposium on. IEEE, 2010, pp. 254-257.
Chun, et al. "A 1.1 V, 667MHz random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.
Chun, et al. "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.
Cao, et al. "A Novel 1T-1D DRAM Cell for Embedded Application." Electron Devices, IEEE Transactions on, vol. 59, No. 5, 2012, pp. 1304-1310.
Collaert, et al. "Substrate bias dependency of sense margin and retention in bulk FinFET 1T-DRAM cells." Solid-State Electronics 65 (2011), pp. 205-210.
Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.
Chatterjee, et al. "Taper isolated dynamic gain RAM cell." Electron Devices Meeting, 1978 International. vol. 24. IEEE, 1978, pp. 698-699.
Chatterjee, et al. Circuit Optimization of the Paper Isolated Dynamic Gain RAM Cell for VLSI Memories, pp. 22-23, 1979 IEEE International Solid-State Circuits Conference.
Chatterjee, et al. "A survey of high-density dynamic RAM cell concepts." Electron Devices, IEEE Transactions on 26.6 (1979): 827-839.
Erb, D. "Stratified charge memory." Solid-State Circuits Conference. Digest of Technical Papers. 1978 IEEE International. vol. 21. IEEE, 1978, pp. 24-25.
Galeti, M., et al. "BJT effect analysis in p-and n-SOI MuGFETs with high-k gate dielectrics and TiN metal gate electrode for a 1T-DRAM application." SOI Conference (SOI), 2011 IEEE International. IEEE, 2011, pp. 1-2.
Gamiz, et al. "3D Trigate 1T-DRAM Memory Cell for 2x nm Nodes." Memory Workshop (IMW), 2012 4th IEEE International. IEEE, 2012, pp. 1-4.
Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.
Giusi, et al. "Bipolar mode operation and scalability of double-gate capacitorless 1T-DRAM cells." Electron Devices, IEEE Transactions on, vol. 57, No. 8 (2010), pp. 1743-1750.

Gupta, et al. "32nm high-density high-speed T-RAM embedded memory technology." Electron Devices Meeting (IEDM), 2010 IEEE International. IEEE, 2010, pp. 12-1.
Han, et al. "Bistable resistor (biristor)-gateless silicon nanowire memory." VLSI Technology (VLSIT), 2010 Symposium on. IEEE, 2010, pp. 171-172.
Han, et al. "Biristor—Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Vertical double gate Z-RAM technology with remarkable low voltage operation for DRAM application." VLSI Technology (VLSIT), 2010 Symposium on, 2010, pp. 163-164.
Kim, et al. "Silicon on replacement insulator (SRI) floating body cell (FBC) memory." VLSI Technology (VLSIT), 2010 Symposium on. IEEE, 2010, pp. 165-166.
Kim, et al. "Optical charge-pumping: A universal trap characterization technique for nanoscale floating body devices." VLSI Technology (VLSIT), 2011 Symposium on. IEEE, 2011, pp. 190-191.
Kim, et al. "Investigation of 1T DRAM cell with non-overlap structure and recessed channel." Silicon Nanoelectronics Workshop (SNW), 2010. IEEE, 2010, pp. 1-2.
Lu, et al., "A Simplified Superior Floating-Body/Gate DRAM Cell", IEEE Elec. Dev. Letters, vol. 30, No. 3, Mar. 2009, pp. 282-284.
Lu, et al., "A Floating-Body/Gate DRAM Cell Upgraded for Long Retention Time", IEEE Elec. Dev. Letters, vol. 32, No. 6, pp. 731-733, Jun. 2011.
Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.
Lee, et al. "A Novel Capacitorless 1T DRAM Cell for Data Retention Time Improvement." Nanotechnology, IEEE Transactions on, vol. 10, No. 3, 2011, pp. 462-466.
Leiss, et al, "dRAM Design Using the Taper-Isolated Dynamic RAM Cell." Solid-State Circuits, IEEE Journal of 17.2 (1982): 337-344.
Mahatme, et al. "Total ionizing dose effects on ultra thin buried oxide floating body memories." Reliability Physics Symposium (IRPS), 2012 IEEE International, 2012, pp. 1-5.
Moon, et al. "Fin-width dependence of BJT-based 1T-DRAM implemented on FinFET." Electron Device Letters, vol. 31, No. 9 (2010): 909-911.
Moon, et al. "An optically assisted program method for capacitorless 1T-DRAM." Electron Devices, IEEE Transactions on, vol. 57, No. 7, 2010, pp. 1714-1718.
Moon, et al. "Multi-functional universal device using a band-engineered vertical structure." Electron Devices Meeting (IEDM), 2011 IEEE International. IEEE, 2011, pp. 24.6.2-24.6.4.
Moon, et al. "Ultimately scaled 20nm unified-RAM." Electron Devices Meeting (IEDM), 2010 IEEE International. IEEE, 2010, pp. 12.2.1-12.2.4.
Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Ohsawa, et al, "A Novel Capacitor-less DRAM Cell: Floating Body Cell", CRC Press, Taylor & Francis Group, 2012, pp. 1-7.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Okhonin, et al. A Capicitor-Less 1T-DRAM Cell, IEEE Electron Device Letters, vol. 23, No. 2, Feb. 2002, pp. 85-87.
Ohsawa, et al. "Autonomous refresh of floating body cell (FBC)." Electron Devices Meeting, 2008. IEDM 2008. IEEE International. IEEE, 2008, pp. 801-804.
Ohsawa et al., Memory Design Using One-Transistor Gain Cell on SOI, Tech. Digest, IEEE International Solid-State Circuits, vol. 37, No. 11, 2002, pp. 1510-1522.

(56) References Cited

OTHER PUBLICATIONS

Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.
Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.
Campardo G. et al., VLSI Design of Non-Volatile Memories, Springer Berlin Heidelberg New York, 2005, pp. 94-95.
Cho et al., A novel capacitor-less DRAM cell using Thin Capacitively-Coupled Thyristor (TCCT), pp. 1-4, 2005.
Celler et al., "Frontiers of Silicon-on-insulator", Journal of Applied Physics, vol. 93, No. 9, pp. 4955-4978, May 2003.
Han et al. Programming/Erasing Characteristics of 45 nm NOR-Type Flash Memory Based on SOI FinFET Structure. J. Korean Phys. Society, vol. 47, Nov. 2005, pp. S564-S567.
Headland. Hot electron injection, Feb. 19, 2004.
Langholz, et al., Foundations of Digital Logic Design, World Scientific Publishing Co., 1998, pp. 339-342 and 344.
Lanyon, et al., "Bandgap Narrowing in Moderately to Heavily Doped Silicon", IEEE Trans. on Electron Devices, vol. ED-26, No. 7, 1979, pp. 1014-1018.
Lin, et al., "A new 1T DRAM Cell with enhanced Floating Body Effect", Proc. of 2006 IEEE International Workshop on Memory Tech., Design and Testing, pp. 1-5, 2006.
Montaanaro et al., A 160-MHz, 32-b, 05-W CMOS RISC Microprocessor, IEEE J. Solid State Circuits, vol. 31, No. 11, pp. 1703-1714, Nov. 1996.
Oh, et al., "A 4-Bit Double SONOS memory (DSM) with 4 Storage Nodes Per Cell for Ultimate Multi-Bit Operation", 2006 Symposium on VLSI Tech. Digest of Tech. Papers, pp. 1-2, 2006.
Okhonin, et al., Principles of Transient Charge Pumping on Partially Depleted SOI MOSFETs, IEEE Electron Device Letters, vol. 23, No. 5, May 2002, pp. 279-281.
Okhonin et al. A SOI Capacitor-less 1T-DRAM Concept, 2001IEEE International SOI Conference, 2001, pp. 153-154.
Ohsawa et al., An 18.5ns 128Mb SOI DRAM with a Floating body Cell, IEEE International Solid-State Circuits Conference, 2005, pp. 458-459, 609.
Pellizzer et al., A 90nm Phase Change Memory Technology for Stand-Alone Non-Volatile Memory Applications, IEEE 2006 Symposium on VLSI Tech. Digest of Tech. Papers, pp. 1-2, 2006.
Ranica, et al. "Scaled 1T-Bulk devices built with CMOS 90nm technology for low-cost eDRAM applications." VLSI Technology, 2005. Digest of Technical Papers. 2005 Symposium on. IEEE, 2005, pp. 38-39.
Rothemund, et al., The importance of being modular, Nature, vol. 485, May 2012 pp. 584-585.
Reisch, "On bistable behavior and open-base breakdown of bipolar transistors in the avalanche regime-modeling and applications." Electron Devices, IEEE Transactions on 39.6 (1992): 1398-1409.
Robert F. Pierret. Semiconductor Device Fundamentals, ISBN: 0-201-54393-1, 1996, by Addison-Wesley Publishing Company, Inc. PNPN Devices 463-476.
Rodriguez, et al. "A-RAM: Novel capacitor-less DRAM memory." in SOI Conference, 2009 IEEE International, pp. 1-2. IEEE, 2009.
Rodriguez, et al. "A-RAM memory cell: concept and operation." Electron Device Letters, IEEE, vol. 31, No. 9 (2010), pp. 972-974.
Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.
Romanjek, et al., "Compact (WG/LG=80/85nm) FDSOI 1T-DRAM programmed by Meta Stable Dip", Ultimate Integration on Silicon (ULIS), 2012 13th International Conference on, Mar. 6, 2012, pp. 199-202.
Sugizaki et al., Ultra-high-speed Novel Bulk Thyristor-SRAM (BT-RAM) Cell with Selective Epitaxy Anode (SEA), pp. 1-4, 2006.
Sakui, K., et al. "A new static memory cell based on the reverse base current effect of bipolar transistors." Electron Devices, IEEE Transactions on 36.6 (1989): 1215-1217.
Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.
Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.
Shin, et al. "Vertical-Gate Si/SiGe Double-HBT-Based Capacitorless 1T DRAM Cell for Extended Retention Time at Low Latch Voltage." Electron Device Letters, vol. 33, No. 2, 2012, pp. 134-136.
Shin, et al. "A novel double HBT-based capacitorless 1T DRAM cell with Si/SiGe heterojunctions." Electron Device Letters, vol. 32, No. 7, 2011, pp. 850-852.
Sze, et al. Physics of Semiconductor Devices, Wiley-Interscience, 2007, p. 104.
Tack, et al. "The multistable charge-controlled memory effect in SOI MOS transistors at low temperatures." Electron Devices, IEEE Transactions on 37.5 (1990): 1373-1382.
Terada, et al. "A new VLSI memory cell using capacitance coupling (CC cell)." Electron Devices, IEEE Transactions on 31.9 (1984): pp. 319-1324.
Villaret, et al. "Further insight into the physics and modeling of floating-body capacitorless DRAMs." Electron Devices, IEEE Transactions on 52.11 (2005): pp. 2447-2454.
Ventrice, et al. "Analytical model of deeply-scaled thyristors for memory applications." Microelectronics and Electron Devices (WMED), 2012 IEEE Workshop on. IEEE, 2012, pp. 1-4.
Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.
Yoshida et al., A Design of a Capacitorless 1T-DRAM Cell Using Gate-Induced Drain Leakage (GIDL) Current for Low-power and High-speed Embedded Memory , International Electron Devices Meeting, 2003, pp. 1-4.
Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.
Ohsawa, et al. Autonomous refresh of floating body cell (FBC), IEEE, pp. 801-804, 2008.
Ohsawa, et al. Autonomous refresh of floating-body cell due to Current Anomaly of Impact Ionization, IEEE Transactions on Electron Devices, vol. 56, No. 10, pp. 2302-2311, 2009.
Ohsawa et al., "A Novel Capacitor-less DRAM Cell Floating Body Cell", Pan Stanford Publishing, 2012, Table of Contents and Preface.
Villaret et al., "Mechanisms of charge modulation in the floating body of triple-well nMOSFET capacitor-less DRAMs", Microelectronic Engineering 72 (2004) 434-439.

* cited by examiner

US 9,281,022 B2

SYSTEMS AND METHODS FOR REDUCING STANDBY POWER IN FLOATING BODY MEMORY DEVICES

CROSS-REFERENCE

This application claims the benefit of U.S. Provisional Application Nos. 61/844,832, filed Jul. 10, 2013 and 61/846,720, filed Jul. 16, 2013, both of which are hereby incorporated herein, in their entireties, by reference thereto.

FIELD OF THE INVENTION

The present invention relates to semiconductor memory technology. More specifically, the invention relates to a semiconductor device utilizing an electrically floating body transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

A DRAM cell without a capacitor has been investigated previously. Such memory eliminates the capacitor used in the conventional 1T/1C memory cell, and thus is easier to scale to smaller feature size. In addition, such memory allows for a smaller cell size compared to the conventional 1T/1C memory cell. Chatterjee et al. have proposed a Taper Isolated DRAM cell concept in "Taper Isolated Dynamic Gain RAM Cell", P. K. Chatterjee et al., pp. 698-699, International Electron Devices Meeting, 1978 ("Chatterjee-1"), "Circuit Optimization of the Taper Isolated Dynamic Gain RAM Cell for VLSI Memories", P. K. Chatterjee et al., pp. 22-23, IEEE International Solid-State Circuits Conference, February 1979 ("Chatterjee-2"), and "DRAM Design Using the Taper-Isolated Dynamic RAM Cell", J. E. Leiss et al., pp. 337-344, IEEE Journal of Solid-State Circuits, vol. SC-17, no. 2, April 1982 ("Leiss"), which are hereby incorporated herein, in their entireties, by reference thereto. The holes are stored in a local potential minimum, which looks like a bowling alley, where a potential barrier for stored holes is provided. The channel region of the Taper Isolated DRAM cell contains a deep n-type implant and a shallow p-type implant. As shown in "A Survey of High-Density Dynamic RAM Cell Concepts", P. K. Chatterjee et al., pp. 827-839, IEEE Transactions on Electron Devices, vol. ED-26, no. 6, June 1979 ("Chatterjee-3"), which is hereby incorporated herein, in its entireties, by reference thereto, the deep n-type implant isolates the shallow p-type implant and connects the n-type source and drain regions.

Terada et al. have proposed a Capacitance Coupling (CC) cell in "A New VLSI Memory Cell Using Capacitance Coupling (CC) Cell", K. Terada et al., pp. 1319-1324, IEEE Transactions on Electron Devices, vol. ED-31, no. 9, September 1984 ("Terada"), while Erb has proposed Stratified Charge Memory in "Stratified Charge Memory", D. M. Erb, pp. 24-25, IEEE International Solid-State Circuits Conference, February 1978 ("Erb"), both of which are hereby incorporated herein, in their entireties, by reference thereto.

DRAM based on the electrically floating body effect has been proposed both in silicon-on-insulator (SOI) substrate (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 ("Okhonin") and "Memory Design Using One-Transistor Gain Cell on SOI", T. Ohsawa et al., pp. 152-153, Tech. Digest, 2002 IEEE International Solid-State Circuits Conference, February 2002 ("Ohsawa"), which are hereby incorporated herein, in their entireties, by reference thereto) and in bulk silicon (see for example "A one transistor cell on bulk substrate (1T-Bulk) for low-cost and high density eDRAM", R. Ranica et al., pp. 128-129, Digest of Technical Papers, 2004 Symposium on VLSI Technology, June 2004 ("Ranica-1"), "Scaled 1T-Bulk Devices Built with CMOS 90 nm Technology for Low-Cost eDRAM Applications", R. Ranica et al., 2005 Symposium on VLSI Technology, Digest of Technical Papers ("Ranica-2"), "Further Insight Into the Physics and Modeling of Floating-Body Capacitorless DRAMs", A. Villaret et al, pp. 2447-2454, IEEE Transactions on Electron Devices, vol. 52, no. 11, November 2005 ("Villaret"), "Simulation of intrinsic bipolar transistor mechanisms for future capacitor-less eDRAM on bulk substrate", R. Pulicani et al., pp. 966-969, 2010 17$^{th}$ IEEE International Conference on Electronics, Circuits, and Systems (ICECS) ("Pulicani"), which are hereby incorporated herein, in their entireties, by reference thereto).

Widjaja and Or-Bach describes a bi-stable SRAM cell incorporating a floating body transistor, where more than one stable state exists for each memory cell (for example as described in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto). This bi-stability is achieved due to the applied back bias which causes impact ionization and generates holes to compensate for the charge leakage current and recombination. During operation as a bi-stable SRAM, the floating body transistor memory cell stores charge in the floating body in order to achieve two stable states. In a low stable state or state 0 the floating body is at a low state or discharged to some voltage such as 0v. In a high stable state or state 1 the floating body is charged to a higher stable state such as 0.5V. The low stable state will consume little to no standby power beyond a typical NMOS transistor sub threshold leakage. The high stable state however will consume a standby current since a vertical bipolar is enabled to counter any leakage to the floating body.

SUMMARY OF THE INVENTION

In one aspect of the present invention, a method of reducing standby power for a floating body memory array having a plurality of floating body memory cells storing charge representative of data is provided, including: counting bits of data before data enters the array, wherein said counting comprises counting at least one of: a total number of bits at state 1 and a total number of all bits; a total number of bits at state 0 and the total number of all bits; or the total number of bits at state 1 and the total number of bits at state 0; detecting whether the total number of bits at state 1 is greater than the total number of bits at state 0; setting an inversion bit when the total number of bits at state 1 is greater than the total number of bits at state 0; and inverting contents of all the bits of data before writing the bits of data to the memory array when the inversion bit has been set.

In at least one embodiment, the floating body memory cells comprise bi-stable SRAM floating body memory cells.

In at least one embodiment, the method further includes outputting contents of the bits of data from the memory array, wherein the method further comprising inverting the bits of data from the memory array prior to the outputting when the inversion bit has been set.

According to another aspect of the present invention, a system for reducing standby power is provided, the system including: a memory array comprising a plurality of floating body memory cells configured to store charge representative of data; a controller configured to control operations of the system; an inversion bit configured to be set to indicate when an inversion of bit data has been performed; a counter and detector configured to count bits of the data before the data enters the array, wherein the counting comprises counting at least one of: a total number of bits at state 1 and a total number of all bits; a total number of bits at state 0 and the total number of all bits; or the total number of bits at state 1 and the total number of bits at state 0, and to detect whether the total number of bits at state 1 is greater than the total number of bits at state 0; wherein when the total number of bits at state 1 is greater than the total number of bits at state 0, the controller sets the inversion bit; and contents of all the bits of data are inverted before writing the bits of data to the memory array when the inversion bit has been set.

In at least one embodiment, the system further includes a page buffer that receives the data from the counter and detector, buffers the data, and inputs the data to the memory array.

In at least one embodiment, the inversion bit is checked by the controller, prior to reading the data out of the array, wherein the inversion bit has been set, the data from the memory array is inverted to restore the data to its state prior to the previous inversion.

In at least one embodiment, the system is configured so that multiple pages, words or bytes of data can share the inversion bit, wherein upon identifying the need to perform a data inversion, any subsets of the data having been previously written to the array are inverted by reading back the subsets having been previously written, inverting and rewriting the subsets back to the array.

In another aspect of the present invention, a method of reducing standby power for a floating body memory array having a plurality of floating body memory cells arranged in a column and row configuration for storing charge representative of data is provided, the method including: identifying at least one row or column of cells storing data that is no longer needed; and setting each of the cells in the at least one row or column to state 0.

In at least one embodiment, the at least one row or column stores data redundantly.

In another aspect of the present invention, a method of reducing standby power for a floating body memory array having a plurality of floating body memory cells configured with DNWell nodes that can be powered to maintain a high potential in the floating body by a vertical bipolar holding mechanism is provided, the method including: performing at least one of: periodically pulsing a source line of the array; periodically pulsing a bit line of the array; periodically floating the source line; or periodically floating the bit line; wherein the periodically pulsing comprises cyclically applying a pulse of positive voltage to the source line or bit line to turn off the vertical bipolar holding mechanism; and removing the positive voltage between the pulses to turn on the vertical bipolar holding mechanism.

In another aspect of the present invention, a method of tracking the state of a floating body memory cell for turning on and off a vertical bipolar holding mechanism to ensure that a state of the floating body memory cell is maintained is provided, the method including: providing a reference cell that measures a potential level of the floating body of the floating body memory cell; providing a high level floating body potential detector and a low level floating body potential detector; inputting the potential level of the floating body to the high and low level floating body potential detectors; receiving output signals from the high and low level floating body potential detector by a controller; and controlling a voltage regulator to control a voltage level input to a source line, bit line or DNWell line of the floating body memory cell to turn off or turn on the vertical bipolar holding mechanism based upon input signals received from the high level floating body potential detector and the low level floating body potential detector.

In at least one embodiment, when the low level floating body potential detector inputs a signal to the controller indicating that a predetermined low potential has been measured, the controller controls the voltage regulator to increase the voltage level input to the source line or bit line to turn on the vertical bipolar holding mechanism; and when the high level floating body potential detector inputs a signal to the controller indicating that a predetermined high potential has been measured, the controller controls the voltage regulator to turn off the voltage level input to the source line or bit line to turn off the vertical bipolar holding mechanism.

In at least one embodiment, when the low level floating body potential detector inputs a signal to the controller indicating that a predetermined low potential has been measured, the controller controls the voltage regulator to turn off the voltage level input to the DNWell line to turn on the vertical bipolar holding mechanism; and when the high level floating body potential detector inputs a signal to the controller indicating that a predetermined high potential has been measured, the controller controls the voltage regulator to increase the voltage level input to the DNWell line to turn off the vertical bipolar holding mechanism.

In at least one embodiment, the method further includes providing a plurality of the DNWell lines, source lines or bit lines; connecting the plurality of DNWell lines, source lines or bit lines with a plurality of equalization transistors; inputting a signal to the plurality of equalization transistors to turn on the equalization transistors to equalize charge among the plurality of the DNWell lines, source lines or bit lines, prior to the controlling the voltage regulator; and turning off the equalization transistors prior to the controlling the voltage regulator.

In another aspect of the present invention, a semiconductor memory array configured for reducing standby power is provided, the array including: a plurality of floating body memory cells configured to store charge representative of data; and at least two floating body cells serially connected to form a reference cell; wherein current conducted through the at least one of the plurality of floating body memory cells is reduced to a fraction of the current when passing through the reference cell.

In at least one embodiment, the at least two floating body cells of the reference cell are set to state 1.

In at least one embodiment, the reference cell is used for at least one of: a current reference, a voltage reference or a monitor of transient response to bit line discharge.

In another aspect of the present invention, a semiconductor memory array configured for reducing standby power is provided, the array including: a plurality of floating body memory cells configured to store charge representative of data; and at least two more of the floating body memory cells interconnected by a segmented source line to form a reference cell.

In at least one embodiment, a plurality of the reference cells is connected in a dedicated column or row of the array and to different rows or columns of the floating body memory cells configured to store charge representative of data; and a dedicated reference bit line is connected to the plurality of reference cells.

In at least one embodiment, a plurality of the reference cells is connected to different rows or columns of the floating body memory cells configured to store charge representative of data; and source isolation devices are connected between the reference cells.

DETAILED DESCRIPTION OF THE INVENTION

Before the present methods, schemes and devices are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a floating body" includes a plurality of such floating bodies and reference to "the memory cell" includes reference to one or more memory cells and equivalents thereof known to those skilled in the art, and so forth.

The publications discussed herein are provided solely for their disclosure prior to the filing date of the present application. The dates of publication provided may be different from the actual publication dates which may need to be independently confirmed.

Figure 1:
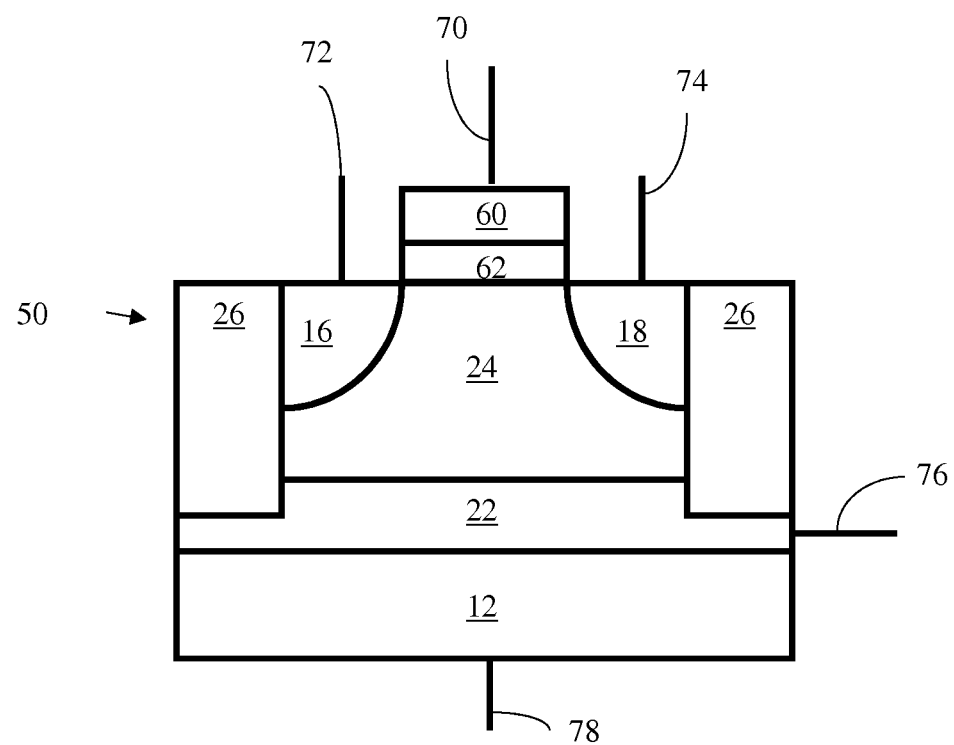
FIG. 1 is a cross-sectional illustration of a floating body SRAM memory cell according to an embodiment of the present invention.

Widjaja and Or-Bach describes a bi-stable SRAM cell incorporating a floating body transistor, where more than one stable state exists for each memory cell (for example as described in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto). This floating body SRAM memory cell device is formed from an NMOS device with a Deep NWell (DNWell) layer to isolate the p-type well of the NMOS transistor. FIG. 1 shows a memory cell 50 where data (in the form of charge/potential) is stored within the floating body 24. The typical bias of the DNWell 22 will be at a high potential such as Vdd while the source 16 and drain 18 voltage are typically at a low potential such as 0v or ground. For state 0, the floating body 24 is at a low potential, such as, but not limited to 0V. In this state, the floating body SRAM cell 50 acts like a normal transistor and has no standby current besides the standard transistor sub-threshold drain to source leakage. A source line 72 is connected to source 16 and a bit line 74 is connected to drain 18. A DNWell line 76 is connected to DNWell 22. DNWell 22 is supported by substrate 12 and a substrate line 78 is connected to substrate 12. Insulators 26 insulate the floating body 24, source 16 and drain 18 from the floating bodies 24, sources 16 and drains 18 of adjacent cells. A gate 60 is provided for input to the floating body 24 via word line 70. A dielectric layer 62 is positioned between the gate 60 and the floating body 24.

For state 1, the floating body 24 will be at a high stable potential, such as, but not limited to 0.5V. Vertical bipolar devices between DNWell 22 and source 16 and drain 18 will turn on to counter any leakage from the floating body 24. However in return this leakage will cause an active standby current. Methods and techniques described within this invention will show how to reduce standby power.

In an array operation typically data will be stored 50% as state 0 and 50% as state 1. However in situations where the data is not symmetrical, an additional inversion flag bit can be provided which indicates that the data within the page, byte or row has been inverted to reduce power consumption for the floating body SRAM memory cell 50. Additional circuitry can be provided during the write data operations to count the number of cells 50 at state 1. If the number of cells 50 at state 1 exceeds 50% of the total number of cells 50 providing data for the page, byte or row, the write circuitry can set the inversion flag and invert the data prior to a writing operation.

Figure 2:
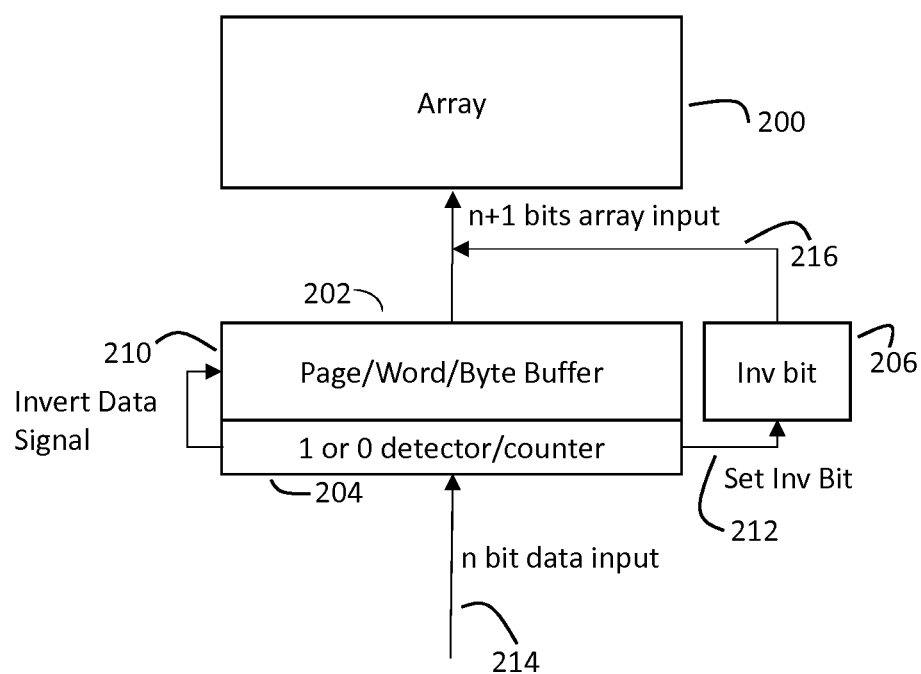
FIG. 2 is a block diagram of a data input operation utilizing a power saving data inversion scheme for floating body SRAM memory cells according to an embodiment of the present invention.

FIG. 2 shows an example of how a block could be designed to use an inversion bit. As data comes into the page buffer 202, a detector/counter 204 is placed before the data can enter the page buffer 202. This detector 204 can detect and count the state of the incoming bits. The counter 204 then keeps track of how many bits are either at state 1 or state 0. Optionally, counter 204 could also keep track of both state 0 and state 1 bits. Prior to writing to the array, the counter 204 can detect if the number of bits at state 1 exceeds the number of bits at state 0. If the state 1 bits are greater in number than the state 0 bits, the inversion bit 206 can be set through signal 212 and a signal or command 210 can be sent to the page buffer 202 to invert the contents of the page buffer 202 prior to writing the data into the array 200. Since the inversion bit 206 now contains the data which determines the polarity of bits within the page/word/byte buffer 202, the inversion bit 206 must also be stored in the array along with the data itself. Line 216 provides the polarity of the page/word/byte buffer 202 and increases the data size by one bit. Note that the operation described above can also occur at a more granular level such as a byte or word, however there is an added cost as the increased granularity of the inversion detection will also increase the total number of inversion bits 206 used within the array.

Figure 3:
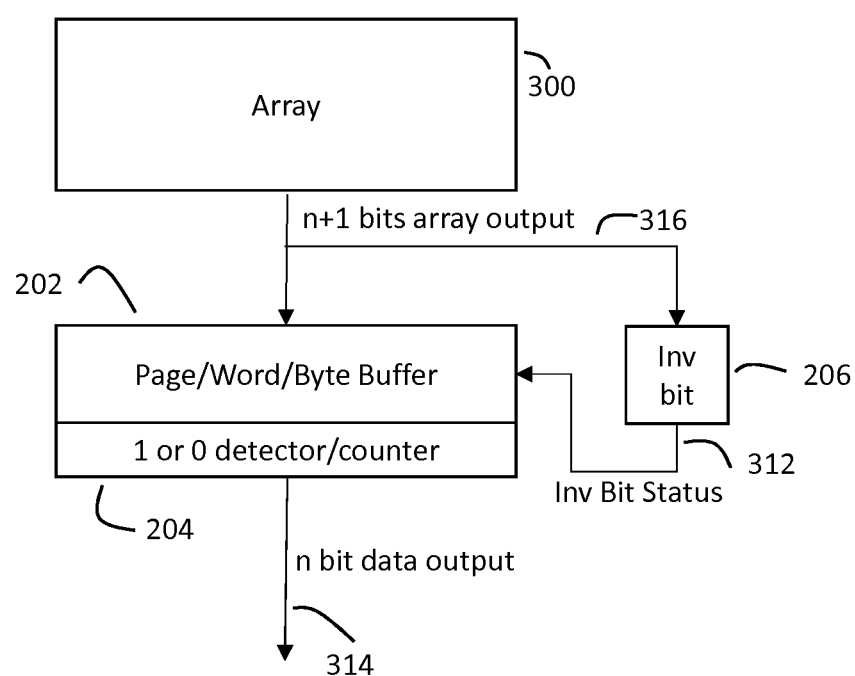
FIG. 3 is a block diagram of a data output operation utilizing a power saving data inversion scheme for floating body SRAM memory cells according to an embodiment of the present invention.

Upon read back of the data within the array the inversion bit 206 must first be checked before data is output as shown in FIG. 3. The inversion bit is routed from the array to the inversion bit register 206 through line 316. If the inversion bit 206 is set, the data from the array requires an inversion prior to outputting the data out of the array. The inversion bit 206 status can be sent to either the page buffer 202 or the bit detector/counter block 204 to signal through signal 312 and indicate to the block 202 or 204 to perform a data inversion prior to data being sent out of the array through 314.

The system could also be designed so that multiple pages, words or bytes could reference a single shared inversion bit 206. However upon identifying the need to perform a data inversion, the previously written data subsets would require a data inversion. For example this could apply on the chip level. Once it was determined that the number of bits in the state 1 status exceeded 50%, a data inversion could be implemented for all the incoming data. At the same time, the system would have to recognize previously written pages and implement a data inversion on those pages. This data inversion on previously written pages could be implemented as a background operation. For example if a 256 bit page was set to utilize a single inversion bit and after writing half of the page, the data was determined to be more than 50% in state 1, the remaining half page will be written with inverted data. The previous half page must have its data inverted so during idle time the previously written data could be read back, inverted and the re-written back to the array.

Figure 17:
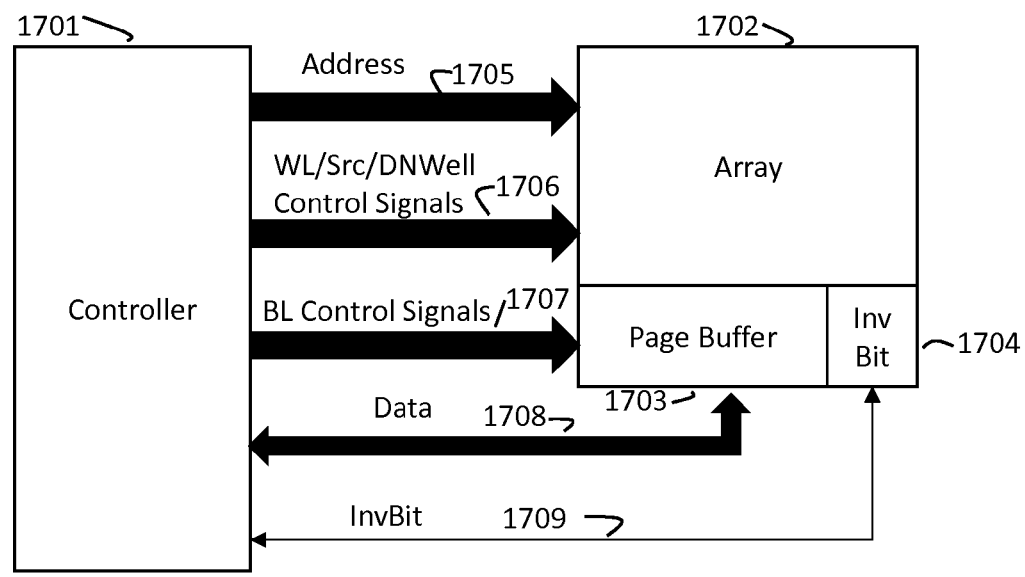
FIG. 17 is a block diagram illustrating a modified controller that implements data state counting and data inversion in addition to its normal array control functions, according to an embodiment of the present invention.

A controller may be modified to implement the data state counting and data inversion in addition to its normal array control functions as shown in FIG. 17. 1701 is the controller block which now contains the logic or algorithm to count the state 1 bits and can implement a data inversion. The data is sent out to the page buffer through bus 1708 and inversion bit is sent out of the controller through line 1709 to the inversion bit buffer 1704. The controller outputs address 1705 and word line/source/DNWell control signals 1706 in addition to bit line control signals 1707.

Another method in which power could be saved would be in a situation where the system determines that data within the row or column of an array is no longer needed. Often times such rows are simply left alone to be overwritten at a later time or an expiration flag bit is set to indicate the contents of the row have expired and/or are no longer valid. In these cases, in order to conserve power in a floating body SRAM array these rows/columns of unused data can all be set to state 0. As mentioned before, since the vertical bipolar is not activated with a low floating body potential voltage, the leakage current from the floating body SRAM device is significantly reduced if unused rows, columns or bits are set to state 0.

This power saving technique can extend to other types of floating body SRAM array constructs such as dummy columns, dummy rows, redundant columns, redundant rows and redundant blocks. In all cases, when the data element is either not being actively used or does not contain any valid data, their contents can be all set to state 0 in order to conserve power within the floating body SRAM array. This can be implemented with minimal design impact by using a common line such as a source line (for redundant rows, blocks and dummy rows) and pulsing the source line negative to implement a write 0 operation. For redundant columns or dummy columns this could be implemented by pulsing the bit line negative to implement a write 0. These conditioning operations would ideally be implemented during or shortly after power up. Additional options would include but are not limited to implementing the preconditioning upon first read or write command, implementing the preconditioning upon a dummy command after power up, implementing the preconditioning during a reset command after power up.

Yet another method to save power in a floating body SRAM array would be to temporarily disable the vertical bipolar holding mechanism by periodically pulsing the source line or bit line high or periodically have the source line or bit line floating. Referring back to FIG. 1, at standby the source line 72 and bit line 74 for a floating body SRAM array is kept at ground to ensure there are vertical bipolar devices between source 16 and the DNWell 22 node and between drain 18 and the DNWell 22 node to hold a high potential in the floating body 24 if the floating body SRAM is set to state 1. Without the vertical bipolar holding mechanism, the floating body SRAM cell 50 will act as a capacitor. During this time, the charge in the floating body 24 will slowly discharge, but at the same time, the power typically consumed by the vertical bipolar holding mechanism to preserve power will also be suspended. When electrically floated, the source line 72 or bit line 74 will eventually charge up through the vertical bipolar holding mechanism until the source line 72 or bit line 74 voltage is high enough to turn off the vertical bipolar holding mechanism. Note also that in this technique, the source line can 72 also be electrically floated instead of being driven to a high potential such as Vdd or 1.2V.

As an example, the bit line 74 can be floated or driven to a high potential such as Vdd or 1.2V to disable the vertical bipolar holding mechanism and the source line 72 can be cycled to conserve power in the floating body SRAM cell 50. In this example, the source line 72 can be alternated between a low potential such as 0V or ground and high potential such as Vdd or 1.2V to repeatedly disable and re-enable the vertical bipolar holding mechanism. As mentioned previously, the source line 72 driver in this case could also be electrically floated instead of being actively driven to Vdd or 1.2V in order to disable the vertical bipolar holding mechanism. Those skilled in the art will understand that the source and drain terminals of a transistor device can be easily interchanged, and accordingly in this invention the source line 72 and bit line 74 terminals can also be interchanged but is not shown.

Figure 4:
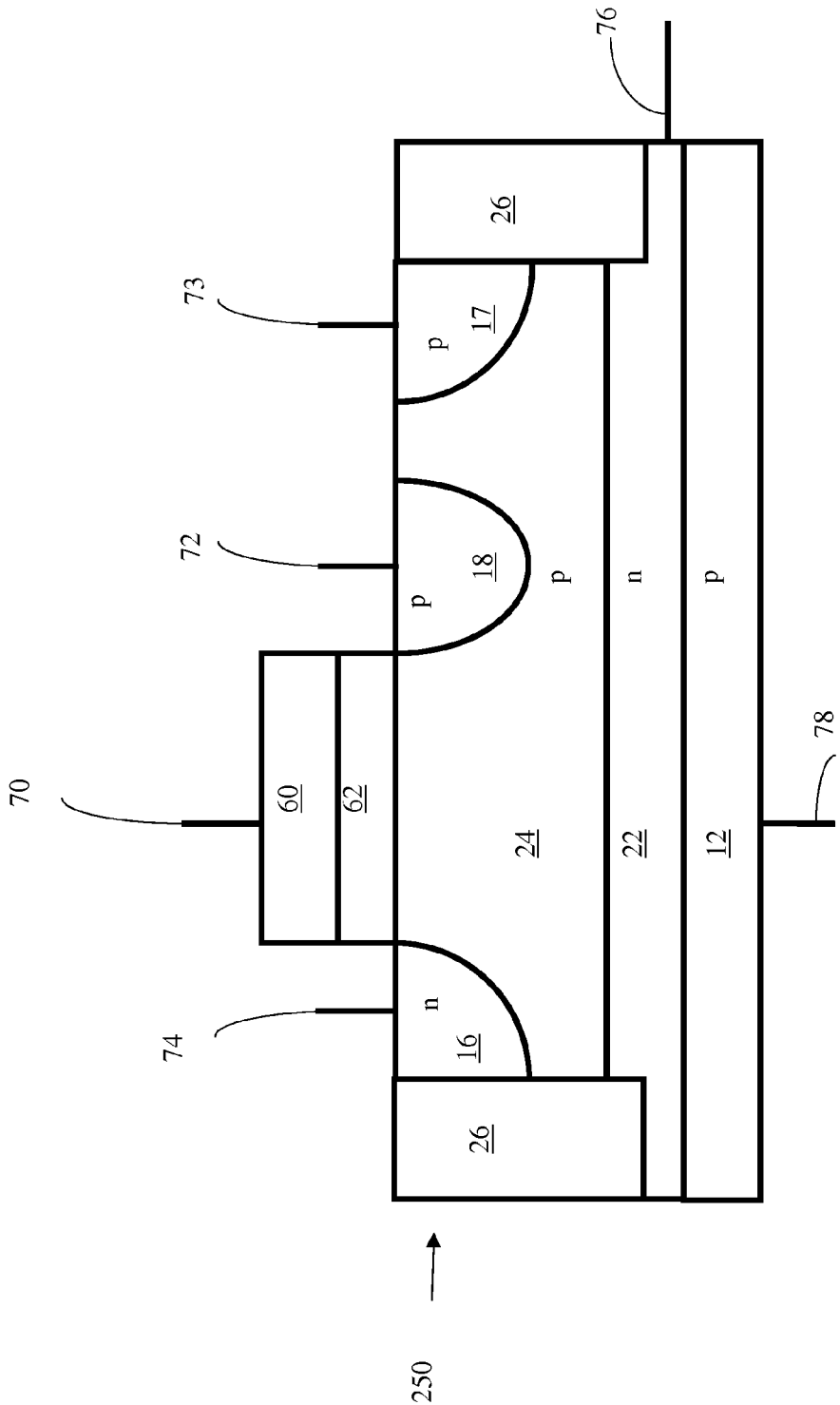
FIG. 4 is a cross-section illustration of a floating body SRAM memory cell with a P+ contact to observe the floating body voltage according to an embodiment of the present invention.
Figure 5:
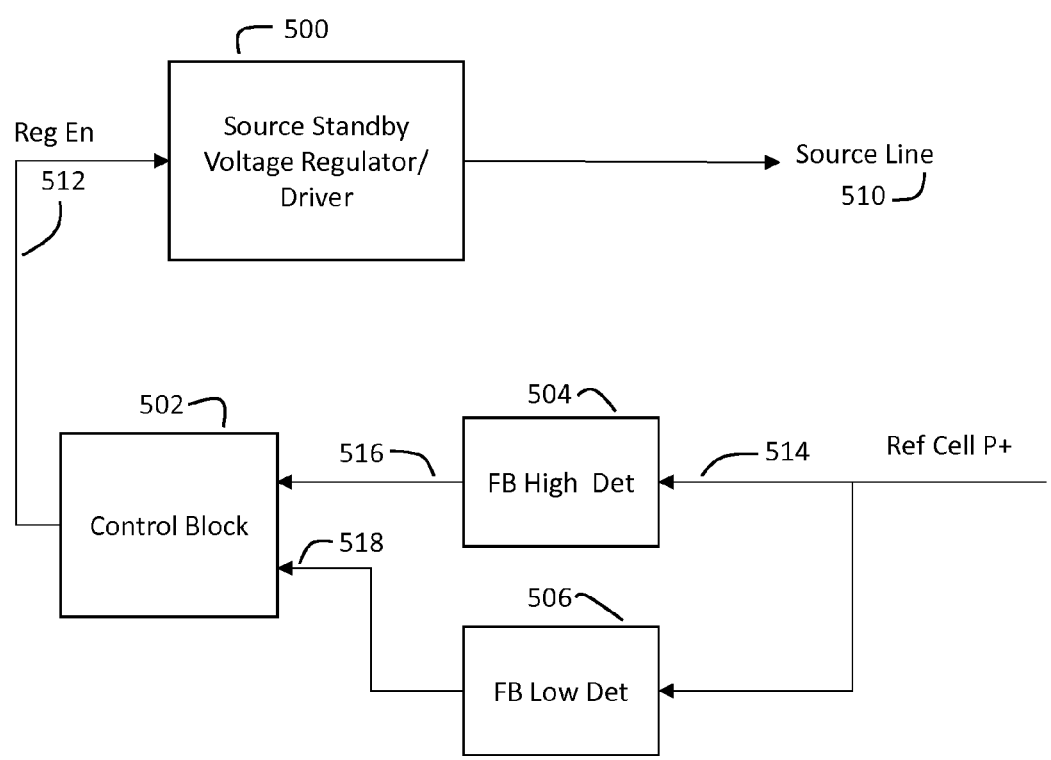
FIG. 5 is a block diagram of a power reduction voltage regulation scheme utilizing source line bias according to an embodiment of the present invention.

In using this technique it is important that the vertical bipolar holding mechanism be restored before the floating body SRAM cells 50 that were previously at state 1 drop below the transition point between state 1 and state 0. To ensure that this threshold is properly detected a reference scheme utilizing a floating body reference cell can be provided. The reference cell 250 shown in FIG. 4 was described by Widjaja in U.S. Patent Application Publication No. 2012/0217549. The reference cell in FIG. 4 is identical to a normal floating body memory cell with the addition of line 73 which connects to p+ node 17 that directly connects to the p+ floating body 24. The p+ connection 17 to the floating body provides a direct measurement of the floating body potential. Utilizing this reference cell 250, the voltage of the floating body 24 can be tracked, and two level detectors can be used to enable a reference supply FIG. 5 is a block diagram detailing a tracking operation as referred to in FIG. 4, according to an embodiment of the present invention. Two level detectors 504, 506 are shown which connect the reference cell P+ connection 73 through line 514. One level detector 504 is set to detect a high floating body potential. A second level detector 506 is set to detect a low floating body potential. Those skilled in the art will understand that there are a variety of methods to implement these detectors such as but not limited to using operational amplifiers, sense amplifiers or differential amplifiers. Possible methods to create the reference side of the detectors 504 and 506 include but are not limited to voltage dividers, bandgap voltages, voltage divided bandgap voltages, transistor resistor dividers, etc.

A control block 502 takes the input from detectors 504 and 506 through signals 516 and 518. The output 512 of control block 502 drives the enablement of the source standby voltage regulator/driver 500. The possible outputs of this standby regulator 500 range from a low potential such as ground/0V to a high output which can be as high as Vdd. Standby source regulator 500 can also float the source line by disconnecting all supplies. The regulator 500 is enabled when driving a high potential or when electrically floating. When disabled the regulator 500 will drive a low potential such as 0V. A possible but non limiting method to implement control block 502 is by using an SR (Set Reset) Latch which may be composed by a pair of cross coupled NOR or NAND gates. In this exemplary implementation, the floating body low voltage detector 506 can be connected to the reset pin of the SR latch to reset or disable the voltage regulator in order to force the source line 510 to ground, restoring the vertical bipolar holding mechanism/device for maintaining the state of the floating body 24 SRAM. This in turn would start to restore the floating body 24 voltage to a higher potential. Once the floating body 24 reaches the trip point of the high detector 504, the control block 502 sets the SR latch to cause the source line 510 to be driven high or electrically floated thus disabling the vertical bipolar holding mechanism, which in turn disables the bi-stability of the floating body 24 SRAM and removes any associated state 1 standby leakage current. When the source line voltage 510 is high or electrically floated, the floating body 24 voltage discharges. Eventually when the floating body 24 discharges to the FB Low Regulator trip, the source standby voltage regulator 500 will be again disabled by the control block 502 via input from the floating body low detector 506 which drives the source line 510 voltage low and re-establishes the vertical bipolar holding mechanism and the floating body 24 SRAM bi-stability. This cycle of events can repeat indefinitely to help improve standby power consumption. Additional logic is needed to combine this operation with normal array operations such as read and write, but this logic can be easily understood and realized by those skilled in the art.

Figure 6:
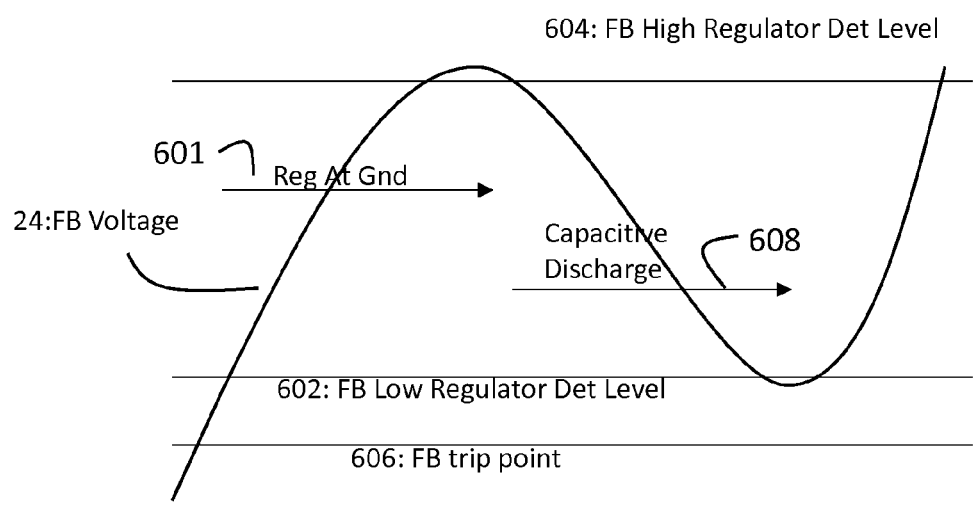
FIG. 6 is a waveform diagram showing the potential behavior of the floating body during a power reduction voltage regulation cycle according to an embodiment of the present invention.

An exemplary graph of the floating body 24 voltage including high and low detect levels, according to an embodiment of the present invention, is provided in FIG. 6. Starting from the left side of the graph, initially the standby regulator 500 is outputting a ground voltage 601 which actively turns on the vertical bipolar holding mechanism in the floating body SRAM memory cells 50. Once the floating body 24 reaches the floating body high regulator detect level 604, the standby source regulator 500 drives the source voltage high, thus disabling the vertical bipolar holding mechanism in the floating body SRAM memory cell 50. Note that the standby source regulator 500 can alternatively electrically float the source line 72 to disable the vertical bipolar holding mechanism. The floating body 24 at this point discharges like a capacitor 608 until the floating body 24 voltage reaches the floating body low regulator detect level 602. At this point the standby source regulator 500 is again driven to ground and the vertical bipolar holding mechanism within the floating body SRAM memory cell 50 is restored thus re-enabling the bi-stability of the floating body cell 50. FB Trip Point 606 represents the voltage at which the FB Memory cell will lose its state 1 data. The FB Low Regulator Det Level 602 is purposely set a voltage higher than 606 in order to prevent loss of data.

Figure 7:
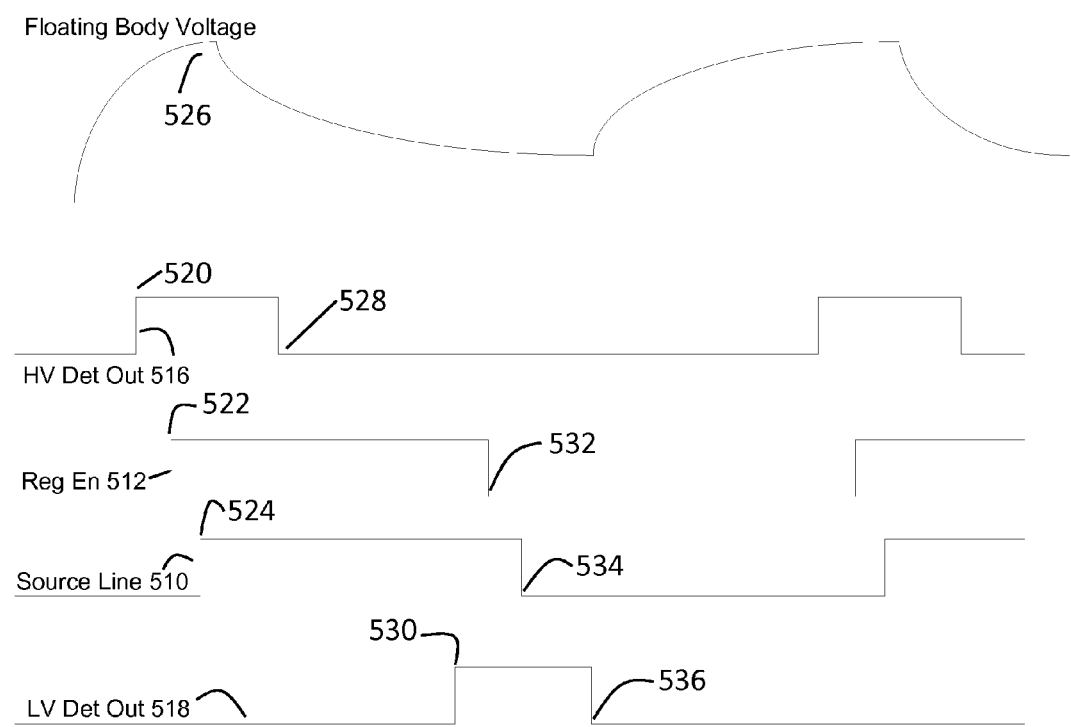
FIG. 7 is a waveform diagram of the floating body, comparator outputs and the regulator inputs according to an embodiment of the present invention.

FIG. 7 illustrates an example of how the output 516 from the floating body high detector block 504, the output 518 from the floating body low detector block 506 and the regulator enabled (Reg En) signal 512 may appear, according to an embodiment of the present invention. Note that this logic waveform is for exemplary purposes only and not meant to limit the scope of this invention. Prior to the operation illustrated in FIG. 7, a write 1 operation has already occurred, and thus the floating body 24 is at a high potential, see 526. Once the floating body 24 reaches the upper regulation point, the high level detector (HV Det Out) signal 516 goes high (see 520), enabling the Reg En signal 512 at 522. This causes the source line 510 to be driven high (or floated), see 524, and disables the vertical bipolar holding mechanism of the floating body SRAM memory cell 50. At this point, the floating body 24 acts as a capacitor with the bi-stability temporarily disabled. Accordingly, due to the capacitive discharge the HV Det Out signal 516 also goes low (see 528) as the floating body voltage drops below the high level detector trip point. However, since it was connected to the set pin of the SR Latch, the Reg En Signal 512 remains high. Once the floating body 24 reaches the low level detector level 602, the floating body low level detector block 506 trigger that the floating body voltage has dropped low by raising the low level detector (LV Det Out) signal 518 high, see 530. The Reg En signal 512 is driven low (see 532) which in turn drives the source line 510 back to ground, see 534. This restores the vertical bipolar holding mechanism of the floating body SRAM memory cell 50 and drives the floating body voltage back high. As the floating body 24 charges back up, the LV Det Out signal 518 turns off again, see 536. The cycle will repeat itself as the floating body 24 charges back up to the point where the high detector block 504 again enables the output 518.

Note that the above figures and examples all are using the source terminal (510, 72) for the power saving technique. As mentioned previously, this same technique can be alternately applied to the bit line 74 instead of the source line 72. In these cases the source line 72 will be driven to a high state or electrically floated while the bit line 74 is alternated between a low potential such as ground or 0V to enable the vertical bipolar holding mechanism, and either electrically floated or actively driven to a high potential such as Vdd or 1.2V to disable the vertical bipolar holding mechanism.

Figure 8:
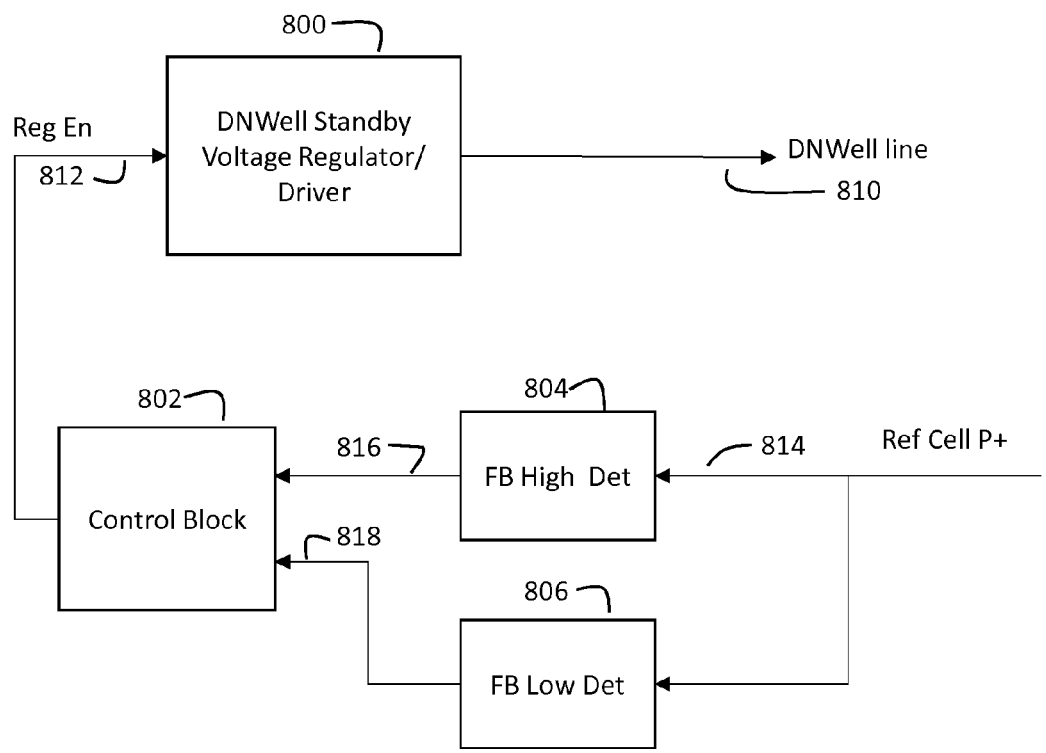
FIG. 8 is a block diagram of a power reduction voltage regulation scheme utilizing DNWell bias according to an embodiment of the present invention.
Figure 9:
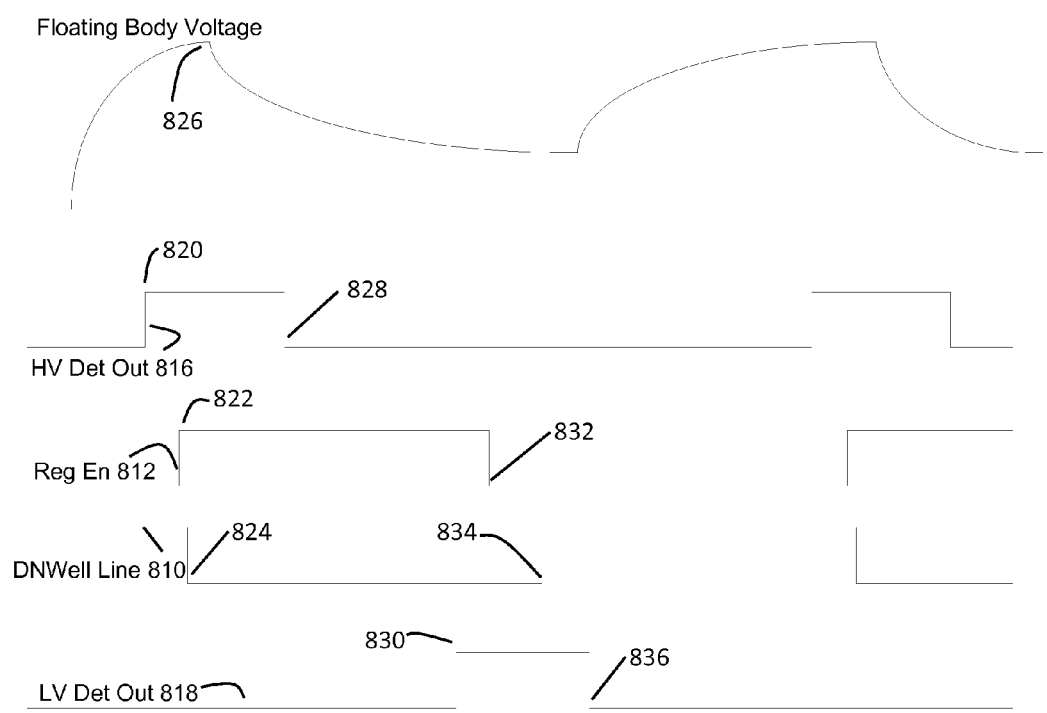
FIG. 9 is a waveform diagram of the floating body, comparator outputs and the regulator inputs according to an embodiment of the present invention.

Alternatively the vertical bipolar holding mechanism of the floating body SRAM memory cell 50 can be disabled by pulling the DNWell terminal 22 of FIG. 1 to a low potential less than Vdd such as 0.6V, 0V or ground, or left floating. This power reduction scheme was first detailed by Widjaja in U.S. Pat. No. 8,130,548. The regulation scheme identified in FIG. 5 can then be adapted based on this alternate principle of using the DNWell to disable the vertical bipolar holding mechanism. The result of this alternate technique using the DNWell bias is shown in FIGS. 8 and 9, according to an embodiment of the present invention. The DNWell line 76, 810 is typically at a high potential during standby as shown in FIG. 9. In comparison, the source line voltage in FIG. 5 is typically at a low potential during standby. Because of this, the inputs to the control block 802 for the standby voltage regulator 800 have to be inverted for the DNWell case as is shown in FIG. 8 and FIG. 9. When the floating body high detector 804 triggers, it sends a signal 816 to the control block which in turn signals the standby regulator 800 through line 812 to drive the DNWell 22 via DNWell line 76, 810 to a lower potential such as but not limited to 0.6V, 0V or ground, or left floating. Conversely when the floating body low detector 806 triggers, the control block 802 is notified through signal 818 which in turn signals 800 through the Reg En signal 812 so that the DNWell 22 is driven back to a high potential such as 1.2V or Vdd to restore the bi-stable behavior of the floating body SRAM memory cell 50

FIG. 9 illustrates an example of how the output 816 from the floating body high detector block 804, the output 818 from the floating body low detector block 806 and the regulator enabled (Reg En) signal 812 may appear, according to an embodiment of the present invention. Note that this logic waveform is for exemplary purposes only and not meant to limit the scope of this invention. Prior to the operation illustrated in FIG. 8, a write 1 operation has already occurred, and thus the floating body 24 is at a high potential, see 826. Once the floating body 24,814 reaches the upper regulation point, the high level detector (HV Det Out) signal 516 goes high (see 520), setting the Reg En signal 812 at 822. This causes the DNWell line 810 to be driven low, see 824, and disables the vertical bipolar holding mechanism of the floating body SRAM memory cell 50. At this point, the floating body 24 acts as a capacitor with the bi-stability temporarily disabled. Accordingly, due to the capacitive discharge the HV Det Out signal 816 also goes low (see 828) as the floating body voltage drops below the high level detector trip point. However, since it was connected to the reset pin of the SR Latch, the Reg En Signal 812 remains high. Once the floating body 24 reaches the low level detector level 602, the floating body low level detector block 806 triggers that the floating body voltage has dropped low by raising the low level detector (LV Det Out) signal 818 high, see 830. The Reg En signal 812 is driven low (see 832) which in turn drives the DNWell line 810 back to ground, see 834. This restores the vertical bipolar holding mechanism of the floating body SRAM memory cell 50 and drives the floating body voltage back high. As the floating body 24 charges back up, the LV Det Out signal 818 turns off again, see 836. The cycle will repeat itself as the floating body 24 charges back up to the point where the high detector block 804 again enables the output 818.

Figure 10:
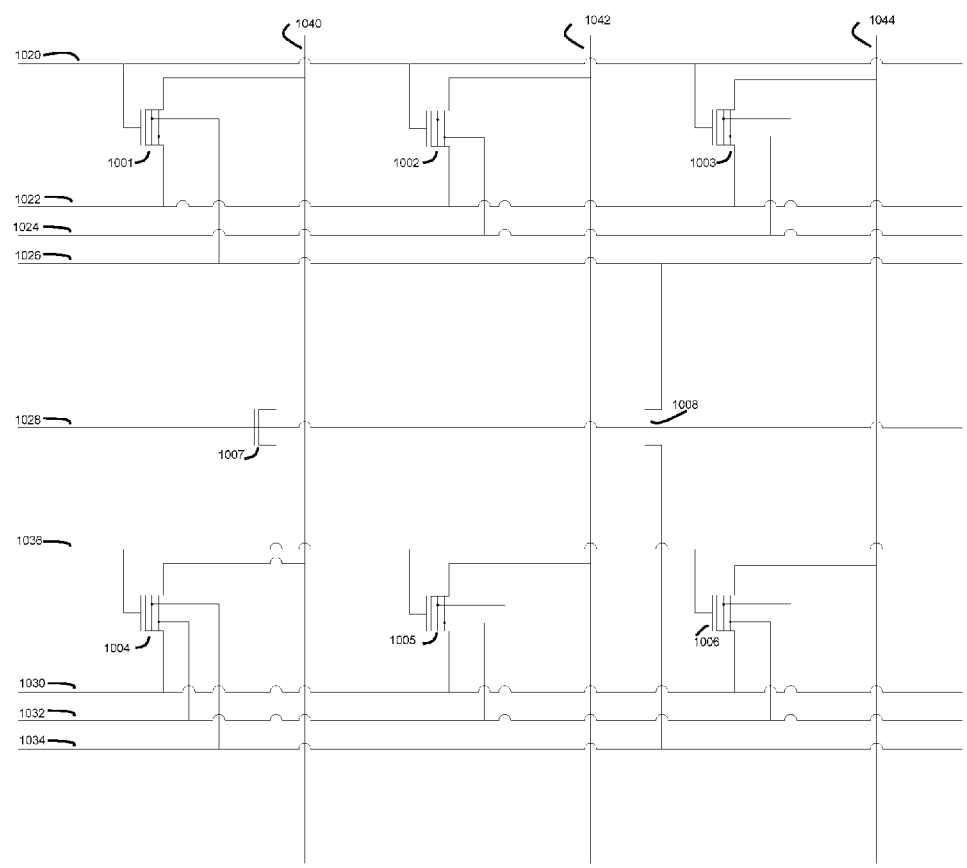
FIG. 10 is a diagram of a charge sharing technique to be used with alternating DNWell supplies according to an embodiment of the present invention.

An additional method in which to conserve energy according to an embodiment of the present invention is shown in FIG. 10. In this embodiment, there are a plurality of FB Memory cells represented by 1001, 1002, 1003, 1004, 1006. Word lines 1020 and 1036 represent two independent word lines of unspecified length. Source lines are represented for each rows with signal 1022 and 1030 which may or may not be electrically shorted together. The FB Memory cell substrate is represented by 1024 and 1032, but typically these will be shorted to the same potential. Two separate and independent DNWell signals are shown at 1026 and 1034. Transistors 1007 and 1008 are equalization transistors which will connect DNWell signals 1026 and 1034 when signal 1028 is asserted. Note only two equalization transistors 1007, 1008 are shown, but those skilled in the art will understand that a plurality of these devices may be necessary based on the resistance, capacitance and length of DNWell lines 1026 and 1034. DNWell signals on DNWell lines 1026 and 1034 are set so that they are opposite one another in polarity so that when 1026 goes low to disable the vertical NPN (bipolar holding mechanism) and conserve power, signal 1034 is driven high to restore the vertical bipolar holding mechanism and restore the floating body 24 to its proper stable state. Prior to having signal 1026 and 1034 change states, DNWell signals 1026 and 1034 can be floated so they are not actively driven. At that point signal 1028 can be temporarily asserted so it will charge share or equalize signals 1026 and 1034. For example if signal 1026 was initially at a high potential such as 1.2V and 1034 was initially a low potential such as 0V, assuming nodes 1026 and 1034 are equal in capacitance when 1028 is asserted with a high potential such as 1.8V, the nodes 1026 and 1034 will equalize via charge sharing to 0.6V. Note that the voltages identified above are for exemplary purposes only and not meant to limit the scope or range of this invention. By charge sharing, DNWell signal 1034 which was initially ground, goes to 0.6V using charge initially stored in DNWell signal 1026. Since DNWell signal 1034 will go to a potential next phase, half the energy in the transition between the low potential and high potential will be conserved due to the charge sharing equalization between the two DNWell nodes. Once the equalization between DNWell signals 1026 and 1034 is complete, 1028 will go low in order to turn off the equalization transistors 1007, 1008. At this point the drivers on signal 1026 and 1034 can be asserted to drive the respective nodes to their desired states. As DNWell nodes 1026 and 1034 will continually alternate between going high and low, this equalization technique can be used at every transition. Note that only two rows and two DNWell signals are shown in FIG. 10, however those skilled in the art will understand that a plurality of rows, blocks or columns of floating body memory cells can have this energy saving technique applied over a plurality of DNWell signals The charge sharing technique described in regard to FIG. 10 can also be applied to a plurality of source lines 72 or a plurality of bit lines 74 instead of to the DNWell terminal 76, 810. In all cases, a plurality of equalization transistors will be required between the alternating elements. For example, if a plurality of source lines 72, 510 are used to disable the vertical bipolar holding mechanism, signals can be alternated between half of the source lines 72, 510 and equalization transistors can be provided between alternating source lines 72, 510. Between transitions of alternating source lines 72, 510, the source drivers are temporarily floated, equalization transistors are turned on to equalize all source lines 72, 510, after which equalization transistors are disabled, and after that the source drivers would again be enabled.

In all of the above charge sharing techniques, the point at which to start the transition between alternating signals is not trivial. A possible non limiting method in which to trigger the alternating transition is to only look at the floating body SRAM reference cell detectors in those floating body SRAM cells 50 that have had their vertical bipolar holding mechanisms disabled. The cells 50 that have had the vertical bipolar holding mechanism disabled are then controlled as described previously to allow the floating body 24 of each of these cells 50 to capacitively discharge. Once the floating bodies 24 of the reference cells 250 have dropped to a set safety point, like the floating body Low Regulator Det Level 602 in FIG. 6, the swap in voltages can be set to occur between alternating signals 1026 and 1034. The detectors on 1034 would be ignored since they have their vertical bipolar holding mechanism enabled. For example, in FIG. 10 if DNWell signal 1026 is at a low potential or electrically floating, the devices 1001, 1002 and 1003 have their vertical bipolar holding mechanisms disabled. A floating body reference cell 250 with detector block can be attached to the same DNWell line 1026 while the detector on DNWell signal 1034 would be ignored. Once the floating body 24 has dropped to a determined minimum safe operating voltage where state 1 can be safely held with margin then a voltage swap operation can be executed between alternating DNWell signals. In this example signal 1026 can be driven back high while 1034 is driven low or electrically floated. Before driving the signals 1026 and 1034 the charge sharing technique would be implemented. The above example uses the DNWell for exemplary purposes only. As mentioned previously the source terminals and bit line terminals can also be pulsed to implement power saving techniques. Those skilled in the art will understand that the method to initiate transition between alternating signals can be easily applied to those constructs as well. An alternate method to implement this scheme would be to disable all the high voltage detects in all of the reference cell 250 voltage detect blocks. Thus only the low floating body voltages would be detected.

An alternative technique to trigger a charge sharing and voltage swap operation is to monitor both alternating signal floating body voltages and initiate the charge sharing swap operation based on the first voltage to hit its target regulation voltage. For example, in FIG. 10 if DNWell signal 1026 is at a low potential or electrically floating, its trigger point would be based on the floating body Low Regulator Detect Level (see 602 on FIG. 6), while signal 1034 would be based on the Floating Body High Regulator Det level (see 604 on FIG. 6). Whichever of these signals reaches their target value first would trigger a charge swap operation and cause the DNWell signals swap between alternating DNWell signals.

Other possible methods to implement a charge sharing operation and voltage swap between alternating supply lines could include but are not limited to: fixed time delay, variable delay based on temperature, variable delay based on programmable trims, and using only a high voltage detect level on the floating body reference cells 250.

Figure 11:
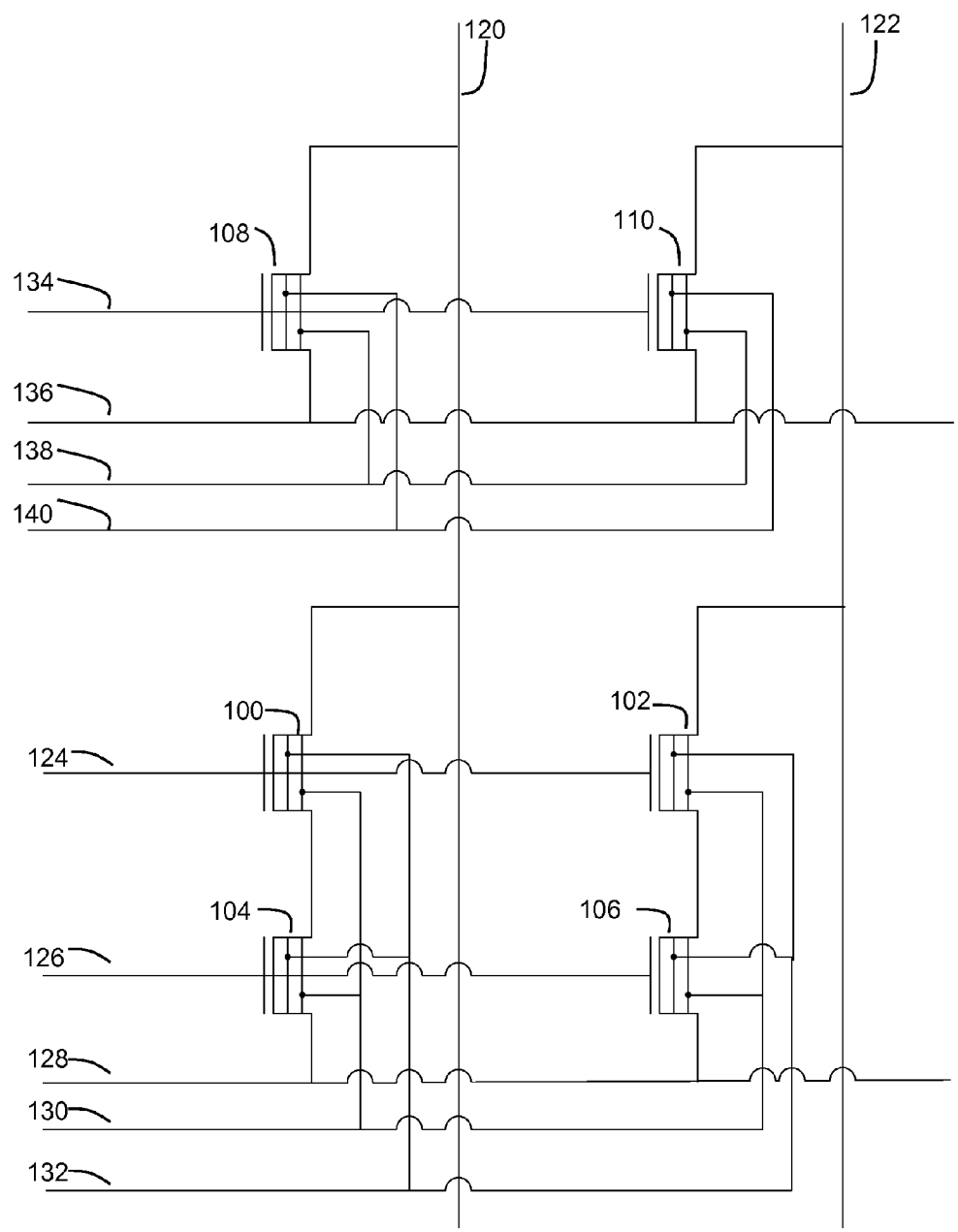
FIG. 11 is a schematic representation of an array using reference cells each comprising two floating body semiconductor cells in series, according to an embodiment of the present invention.

A diagram of another embodiment of the present invention is shown in FIG. 11. Devices 100, 102, 104, 106, 108 and 110 are all floating body SRAM cells of the same width and length. Lines 134, 124 and 126 are word line connections to the gate of the floating body memory cells. Lines 136 and 128 are considered source line connections to the FB Memory cell. 140 and 132 are the DNWell connection to the FB Memory cells and 138 and 130 are the substrate connection for the DNWell memory cells. As mentioned previously, floating body SRAM cells have two stable states. In a low potential state or state 0, the floating body 24 is neutrally charged. In this case, the floating body SRAM cell will behave like a normal transistor. In a high potential case or state 1, the floating body 24 will be positively charged. In this case the horizontal bipolar holding mechanism will be enabled due to the positively charged floating body 24 and this device will be strongly turned on unless a low potential such as 0V or a negative voltage is applied to the gate terminal. Devices 100, 104, 102, and 106 are configured to be floating body reference cells while devices 108 and 110 are exemplary memory cells (like memory cell 50 described with regard to FIG. 1, or some other floating body memory cell configuration) meant to represent memory cells in a memory array. Reference cells 100, 104, 102 and 106 are physically identical to the normal floating body memory cells 108 and 110; however they are electrically connected differently. Devices 100 and 104 are configured to be a single reference cell and are connected serially. Both devices 100 and 104 will be set to state 1 when operating as a reference cell. In a serial connection the current conducted through the floating body SRAM cells 100, 104 will be reduced to approximately half of the normal floating body SRAM cell current due to the effective length of the serial connection being doubled compared to a single cell configuration such as 110. Thus since 100 and 104 can conduct about half the current of a normal device such as 110, this makes the arrangement an ideal reference cell 100, 104 which can track process variations, temperature variations and voltage variations with the array memory cells.

A non-limiting method according to an embodiment of the present invention to set reference cell 100 to state 1 includes setting bit lines 120 to a high potential, such as, but not limited to 0.8V, 1.2V or Vdd, while also setting word lines 124 and 126 to a high potential like 0.8V, 1.2V or Vdd. Source line 128 is at a low potential such as 0V or ground. These bias conditions cause impact ionization on the drain of device 100 which in turn cause holes to be injected into device 100. After enough holes are injected, the floating body SRAM cell 100 will be set to state 1. Cell 104 will not be set to state 1, since the voltage on its source or drain terminals will not be high enough to induce impact ionization. Note that bit line 122 could also have been taken high at the same time that bit line 120 was set high, and this would have allowed the simultaneous setting of cells 100 and 102 to state 1.

To set floating body SRAM cell 104 to state 1, the voltage conditions between source and bit line can be reversed. In this case bit line 120 is set to 0V, while source line 128 is set to a high potential, such as, but not limited to 1.2V. Word lines 124 and 126 will again be taken to a high potential such as 0.8V, 1.2V or Vdd. This will then cause impact ionization on device 104 (and 106, when bit line 122 is also set to 0V). Again holes will be injected into the floating body of device 104 (and 106) until it is set to state 1. Other methods to set floating body devices to state 1 but not shown here are also available, such as, but not limited to: gate coupling, DNWell to floating body p-n junction breakdown, source to floating body p-n junction breakdown and drain to floating body p-n junction breakdown. The example identified here was meant for exemplary purposes only and is not meant to limit the scope of this invention. Terminal 130 is the substrate connection to the floating body SRAM cells 100, 102, 104, 106. For the intents of this invention, this voltage will be always assumed to be a low voltage such as 0V or ground. Terminal 132 is the DNWell connection to the floating body SRAM cells 100, 102, 104, 106. For the intent of this invention, this terminal will always be driven to a high voltage such as 0.8V, 1.2V or Vdd unless mentioned otherwise. Lines 134 is the word line or gate connection for a plurality of floating body memory cells. Line 136 is a source line connected to a plurality of floating body memory cells. Line 138 is the Substrate connection to a plurality of floating body memory cells. Line 140 is the DNWell connection to a plurality of floating body memory cells.

Methods to utilize reference cell (100, 104 and/or 102, 106) can vary as those skilled in the art will appreciate. Pluralities of floating body serial reference cells can be used in rows or columns within an array. These reference cells may also be used in dedicated reference columns, dedicated reference rows, or combinations of both dedicated columns and rows. Possible methods to utilize this reference cell in sense applications include, but are not limited to: using the reference cell as a current reference, using the reference cell as a voltage reference, and using the reference cell as a transient response to the bit line discharge. An exemplary method to utilize this reference cell as a current reference would be to connect a sense amplifier or detector to bit line 120 and have it drive out a fixed voltage. Word lines 124 and 126 will be driven to a high potential such as 1.2V or Vdd. The voltage on this word line would ideally be identical to the voltage applied to a normal array word line. The reference bit line 120 will be driven to a high potential such as 0.8V, 1.0V, 1.2V or Vdd. Source line 128 will be at a low potential such as 0V or ground. This will cause a reference current which is about half of the normal cell current to flow from bit line 120 to source line 128. With the reference current being set at about half of the normal cell current, it becomes an ideal reference for any sense amplifier/detector circuit. Note that the embodiment in FIG. 11 would require that when this reference cell is in use, none of the word lines attached to this same reference bit line be active at the same time. Thus this embodiment is optimally used in a multiple bank architecture where one bank can be used as a reference and while active data is read out from another bank as the selected bank.

An alternative method which would allow for operation within a single bank has dedicated reference bit lines in which the memory cells in the array can be disabled via potential methods such as but not limited to: floating the gates of the memory cells within the reference bit line, floating the sources of the memory cells within the reference bit line, floating the gates and sources of the memory cells within the reference bit line, floating the drain contacts for the memory cells within the reference bit line, grounding the gates of the memory cells within the reference bit line, applying a negative voltage to the memory cells within the reference bit line.

In a single bank architecture, an additional modification must also be made such that non-reference bit lines could disable the reference cells. Methods to disable reference cells in non-reference bit lines include, but are not limited to: grounding the gates of the reference cells in non-reference bit lines; disconnecting drain contact to reference cells in non-reference bit lines; forcing 0V or a negative voltage to shut off reference cells in non-reference bit lines; disconnecting the gates and sources of reference cells; disconnecting gates, source and drain of reference cells. Simply not printing the reference cells on non-reference bit lines is also another option but may have ramifications with layout and yield.

Figure 12:
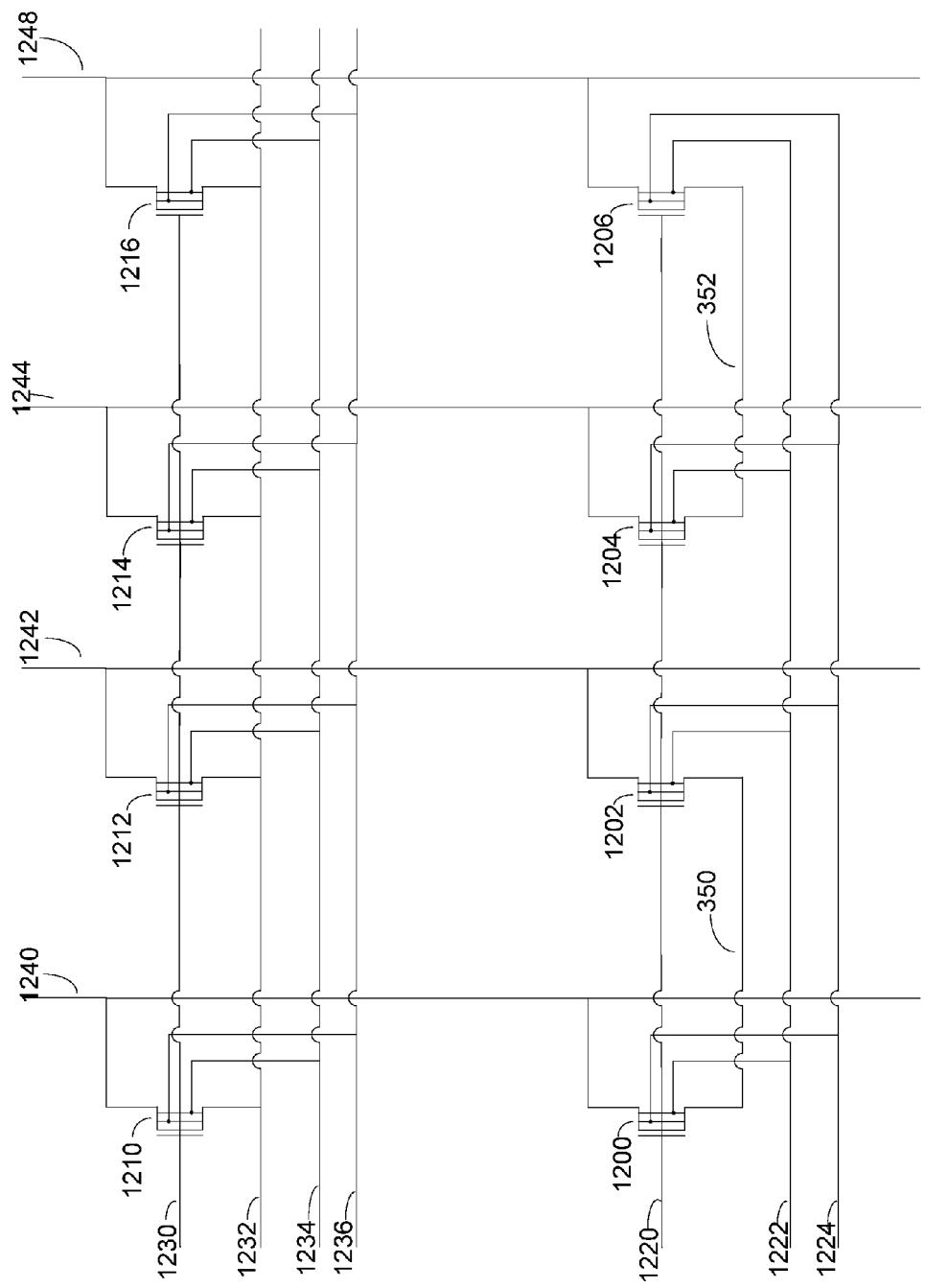
FIG. 12 is a schematic representation of an array using reference cells each comprising two floating body semiconductor cells in series, according to another embodiment of the present invention.
Figure 13:
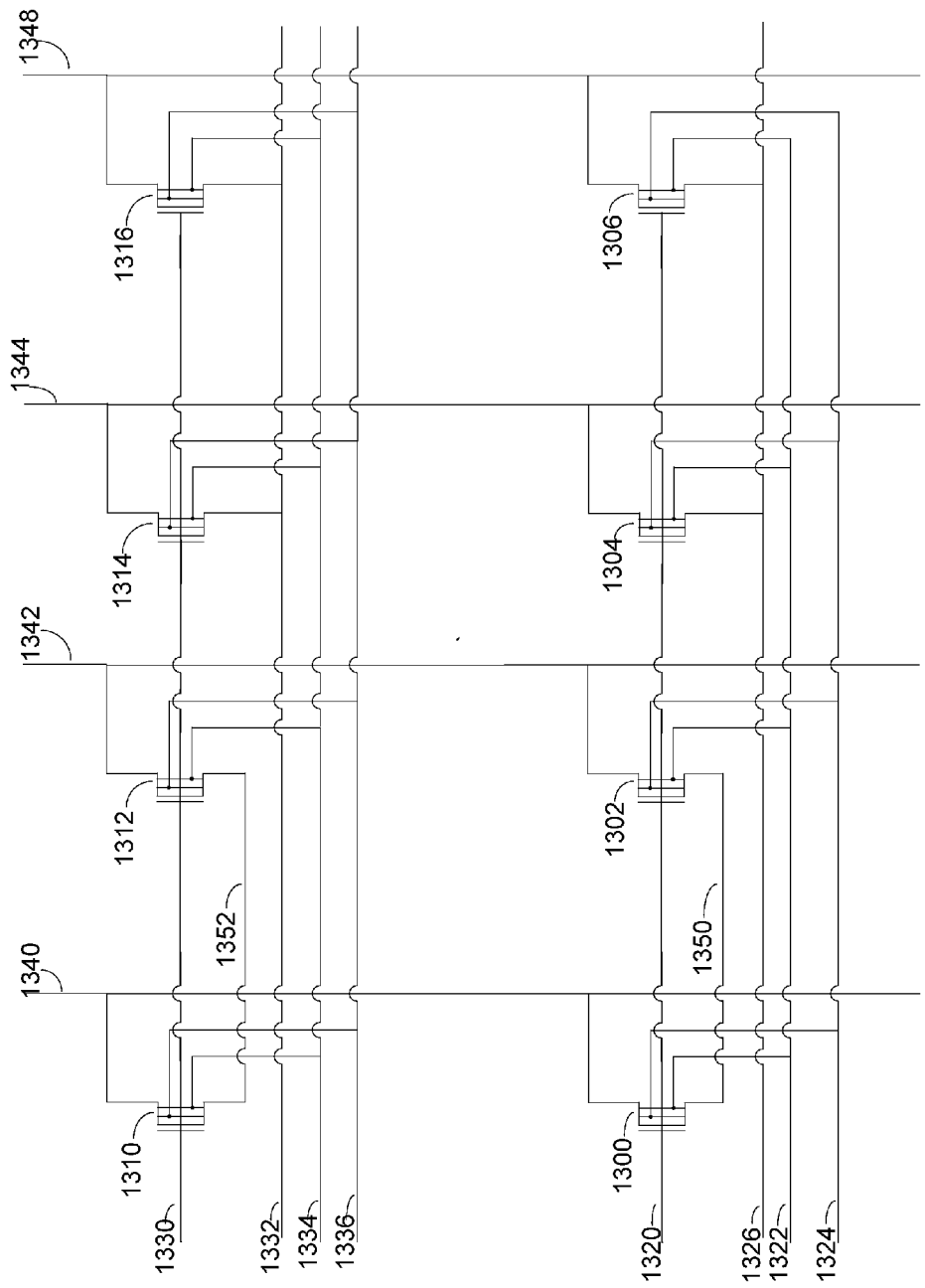
FIG. 13 is a schematic representation of an array using reference cells each comprising two floating body semiconductor cells in series in dedicated reference columns, according to another embodiment of the present invention.

An alternate embodiment of the present invention is shown in FIG. 12. Device pair 1200 and 1202 comprise a reference cell. A second reference cell is also shown comprising devices 1204 and 1206. Cells 1210, 1212, 1214 and 1216 are floating body SRAM memory cells shown here for exemplary purposes. This embodiment is desirable because the differences and changes between the floating body SRAM memory cells in the array and the reference cells are minimized. The only difference between the reference cells and the memory cells is the segmented source lines 350 and 352. This minimal amount of change between the memory cells and reference cells is highly desirable since it minimizes the potential for offsets and variations between the memory cell and the reference cell. A non-limiting example for how this reference cell can be utilized is as follows: bit line 240 can be connected to a sense amplifier/detector block and drive out a high potential such as Vdd, 1.2V or even some other high potential such as 1.0V or 0.8V. Bit line 242 is set to a low potential such as ground or 0V and acts as the ground for this reference pair. Word line 220 is driven to a high potential such as 0.8V, Vcc or 1.2V. DNWell line 222 is, as usual, kept at a high potential such as 0.8V, 1.2V or Vdd. Substrate line 224 is, as usual, kept at a low potential such as ground or 0V. Sense blocks can be placed on either bit line 240 or 242. As the previous example mentioned above in FIG. 11, the sense/detect block can be placed on the bit line 240 and also supply the high potential to generate a reference current/voltage. Alternatively, or additionally, the sense block could be placed on bit line 242 and could also supply the low potential if desired. For uses in which data detected has a small margin between states, wherein there is an elevated risk of error for distinguishing between states, multiple sense blocks may be implemented, but this is a limited use case, as it adds to the cost of production. Note that this embodiment requires two bit lines to be used per reference cell. Word lines for the memory cells attached to the same bit line should not be active when using these reference cells. Also note that the bias conditions on bit lines 240 and 242 can always be freely swapped so that bit line 242 can supply a high potential while bit line 240 would supply the low potential. Devices 210, 211, 214, and 216 are for exemplary purposes and are exemplary in nature showing how a plurality of normal floating body memory cells may be placed next to the reference cells. Terminal 230, 232, 234 and 238 and lines 230, 232, 234, and 236 are the normal floating body memory cell's gate, source, DNWell substrate connections respectively. Bit lines 248 and 244 are provided for exemplary purposes and meant to show how a plurality of columns using this reference cell will be connected In order to set the reference cell 200, 202 to state 1 in this embodiment, the bit line 240 can be driven to a high potential such as Vdd or 1.2V while the opposing bit line 242 is set to a low potential such as ground or 0V. Word line 220 can then be driven to a high voltage such as 0.8V, 1.0V, Vdd or 1.2V. This will induce impact ionization on device 200 which will inject holes into the floating body 24 of device 200. This will in turn set the device to state 1. The bit line conditions can be reversed between bit line 240 and 242 in order to set device 202 to state 1. Another benefit to the embodiment shown in FIG. 12 is exemplified when using the serial reference cells in dedicated reference columns as shown in FIG. 13. Note that this implementation is meant for exemplary purposes only and not meant to limit the scope of this invention. This reference structure shown in this embodiment can easily be applied in both dedicated row and dedicated column applications. Those skilled in the art will understand that with proper bias control, it is entirely possible to use this embodiment in non-dedicated rows and columns as well, intermingled with memory cells. Operation of this embodiment is virtually identical to the embodiment shown in FIG. 12. In this embodiment, 310 and 312 comprise a reference pair of floating body SRAM devices and 300 and 302 comprise a second pair of floating body reference cells. The benefit using this embodiment in conjunction with a dedicated reference bit line is that the same word line that activates the main array memory cells will also be applied to the reference cells. This removes any potential for any sort of word line driver mismatch such as but not limited to voltage mismatch, timing mismatch, and device mismatch.

FIG. 13 shows yet another possible method in which the reference cells can be organized. In this embodiment the reference cells 1310/1312 and 1300/1302 are arranged in columns Word line 1330, source line 1332, DNWell 1336 and substrate connection 1344 are shared between reference cell 1310, 1312 and normal floating body memory cells 1314 and 1316. Word line 1320, Source 1326, Substrate 1322 and DNWell 1324 are shared between reference cells 1300, 1302 and normal floating body memory cells 1304 and 1306. Floating body memory cells 1314, 1316, 1304, 1306 and their respective bit lines 1344 and 1348 are meant to exemplify how a plurality of additional memory cells can be organized with this configuration of reference cells.

Figure 14:
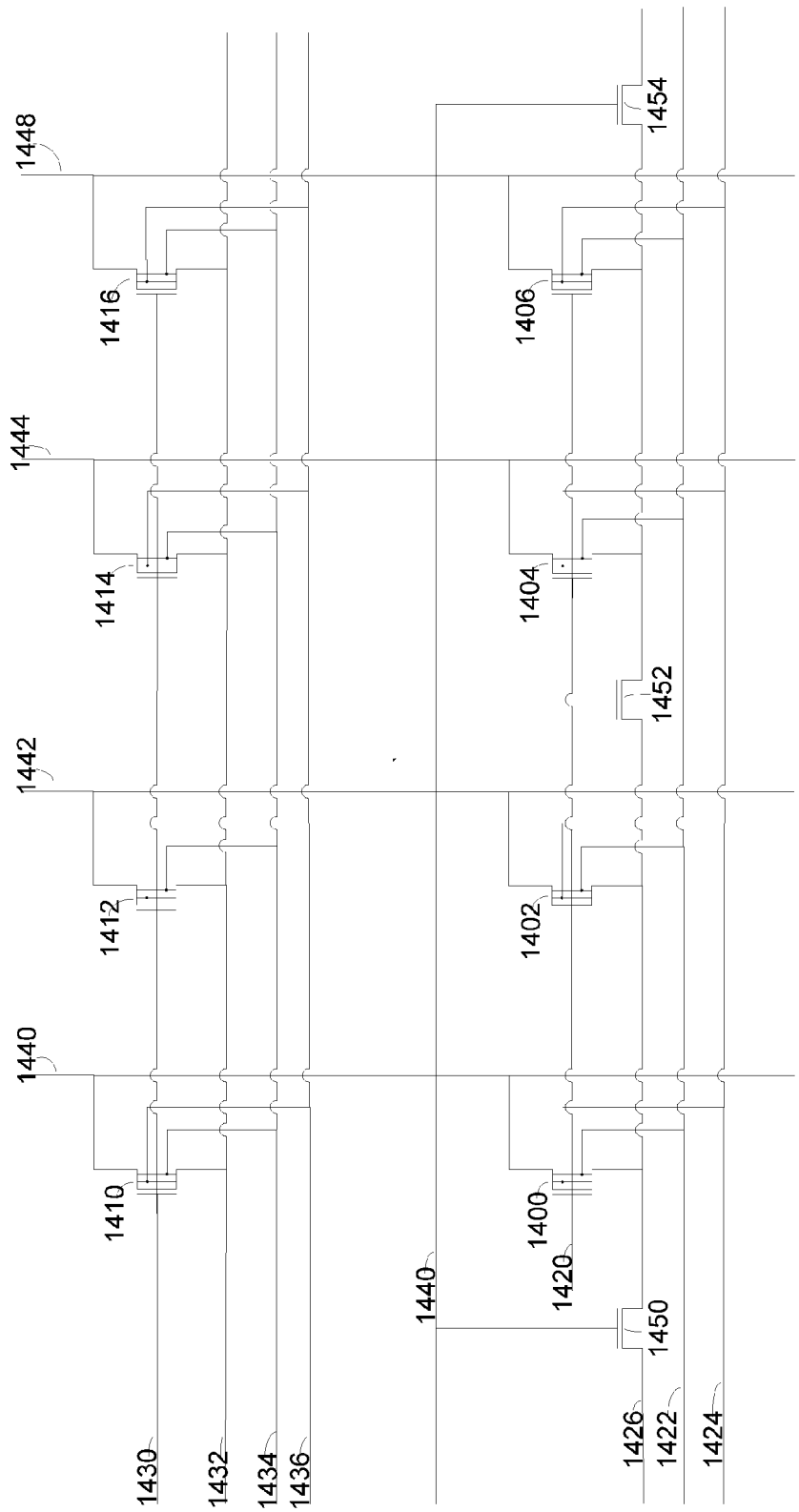
FIG. 14 is a schematic representation of an array using reference cells each comprising two floating body semiconductor cells in series, wherein all reference cells can be simultaneously set to state 1 in a single step, according to another embodiment of the present invention.

Another embodiment is shown in FIG. 14. This embodiment improves on the previous embodiment shown in FIG. 12 by reducing the amount of time it takes in order to set the reference cells to state 1. In this embodiment, all reference cells can be simultaneously set to state 1 in a single step rather than requiring a two-step process like the previous embodiment shown in FIG. 12. Source isolation devices 1450, 1452 and 1454 have been added and repeated between each grouping of reference cells. During normal operation, these source isolation transistors are off, and line 1440 will be at a low potential such as ground or 0V. These reference devices will then function identically to the embodiment shown in FIG. 12. However, when setting the references devices 1400, 1402, 1404 and 1406 to state 1, the source isolation devices 1450, 1452, and 1454 will be enabled, while source line 1426 is driven to a low potential such as ground or 0V. Bit lines of the reference cells that are to be set to state 1 will then be driven to a high voltage such as Vdd or 1.2V. Word line 420 will be then taken to a high potential such as 0.8V, 1.0V, 1.2V or Vdd. This will cause impact ionization for each of the reference cells and in turn set all the reference cells to state 1 in a single operation. Methods to set these serial reference cells to state 1 are not limited to only using impact ionization but also include but are not limited to: gate coupling; source/drain p-n junction breakdown to floating body; DNWell to floating body p-n junction breakdown.

Note that the example in FIG. 14 only shows 2 serial reference cell device pairs 1400/1402 and 1404/1406 simultaneously. In FIG. 14 signals 1430, 1432, 1434 and 1436 represent the respective word line, source line, substrate and DNWell connection to normal floating body memory cells 1410, 1412, 1414 and 1416. Bit lines 1442, 1444, 1444, and 1448 are shared between normal floating body memory cells and the reference cell pairs of 1400, 1402 and 1404, 1406. Line 1420 is the word line or gate connection of the reference cells. Line 1426 is the reference cell source line. 1422 is the reference cell substrate and 1424 is the reference cell DNwell. Line 1440 is the control for the isolation devices 1450, 1452 and 1454. Those skilled in the art will realize that this example is for exemplary purposes only and not meant to limit this invention. A plurality of serial reference cell device pairs can be used along with a plurality of source isolation devices. FIG. 14 also depicts a dedicated reference word line, however those skilled in the art will understand that this embodiment can easily be applied to dedicated reference bit lines. For example to apply this concept toward FIG. 13, additional devices would be required to connect segmented source line 1352 to segmented source line 1350. Additional devices would then be required to connect these segmented source lines with the all the remaining segmented source lines within the same reference column. This in turn creates a vertical source similar to 1426 which could be possibly used in a single operation reference line write.

Figure 15:
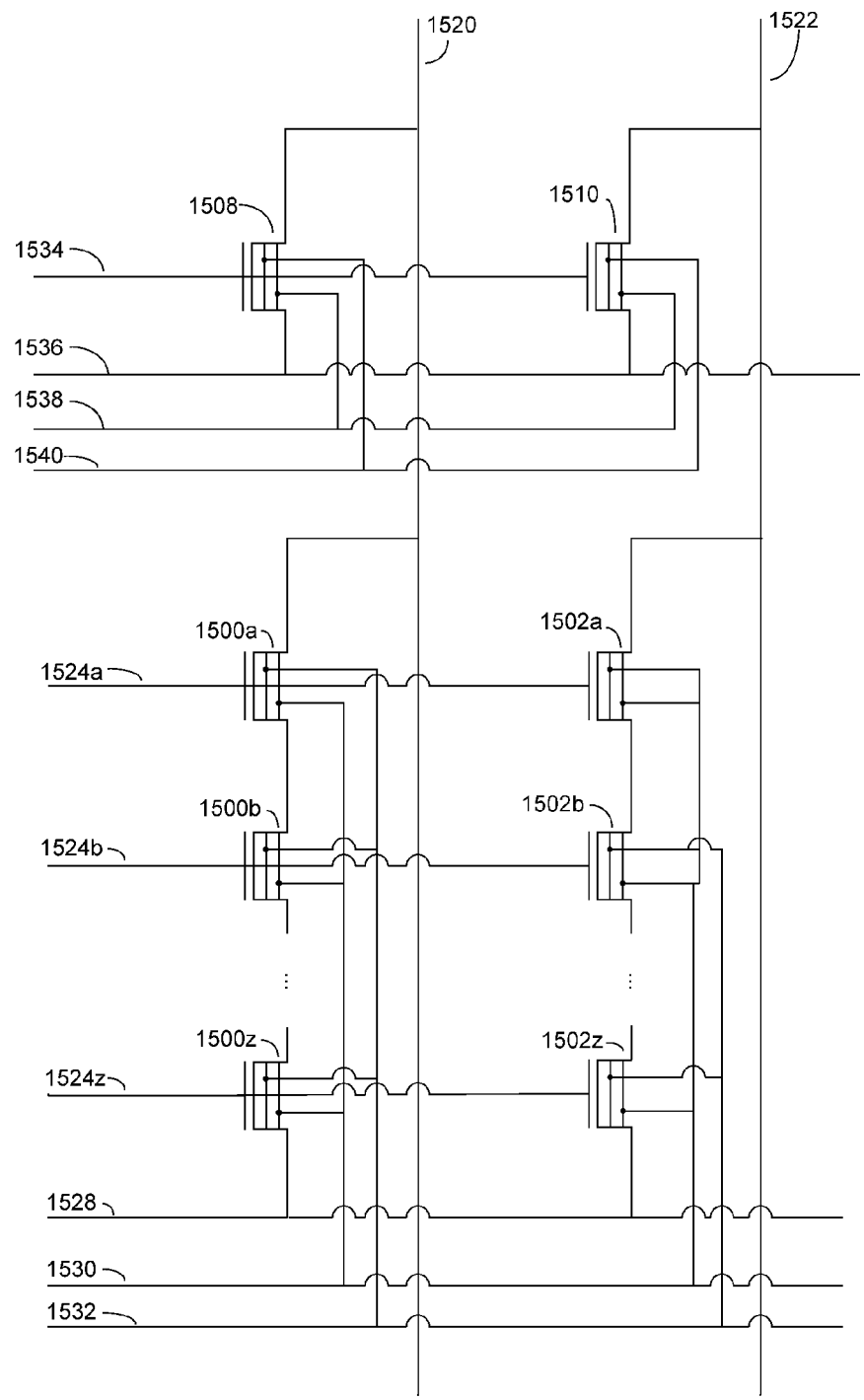
FIG. 15 is a schematic representation of an array using reference cells each comprising more than two floating body semiconductor cells in series, according to another embodiment of the present invention.
Figure 16:
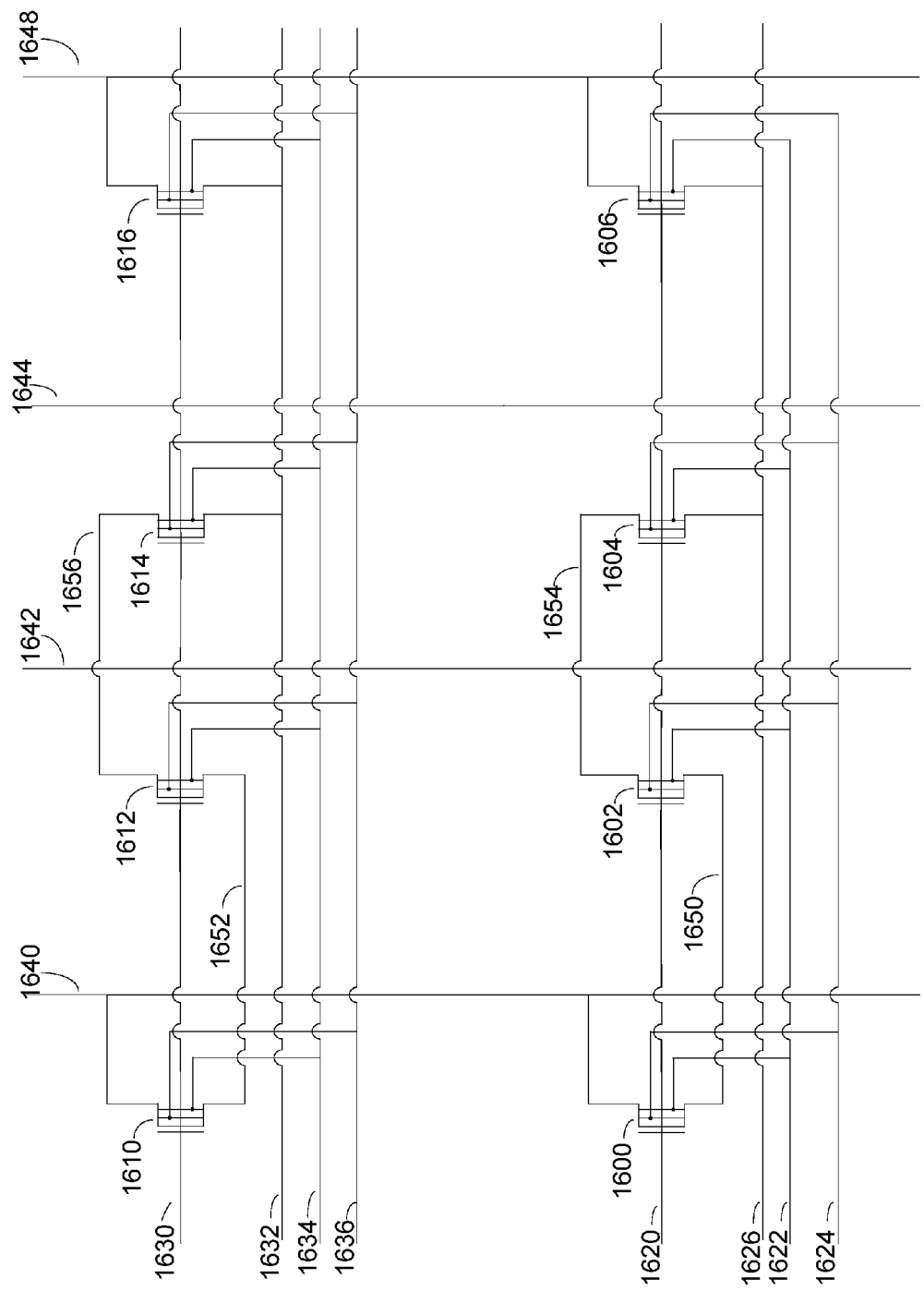
FIG. 16 is a schematic representation of the array of FIG. 15 applied to a dedicated bit line orientation according to an embodiment of the present invention.

Yet another embodiment is shown in FIG. 15. In this embodiment a plurality of floating body SRAM cells are added to the reference chain, i.e., more than two floating body SRAM cells are serially connected to make a reference cell. Adding additional floating body SRAM cells to the chain further reduces the current through the reference cells. For example, if three reference cells are used in series, the reference current will be cut to about one third of the normal cell current. This allows for the selectivity of reference current that is less than half the original SRAM cell current. This may be desirable in cases where there are large cell to cell variations in current and the reference level needs to be lowered in order to provide sufficient read margin for reliable operation. In FIG. 15 cells 1500a to 1500z are floating body memory cells connected serially in order to create a reference cell. 1528 is the source line for the serial string of floating body memory cells. 1530 is the shared substrate connection for this serial string. 1532 is the DNWell connection for the serial string. 1502a through 1502z is an identical string of serially connected floating body memory cells connected to create a reference cell. It also shares the same source line 1528, DNWell connection 1532 and the same substrate connection 1530. 1524a to 1524z are the gate or word line connections for the serially connected floating body memory cell devices. Floating body memory cells 1508 and 1510 are for exemplary purposes indicating how normal floating body memory cells can share the same bit lines 1520 and 1522 as the reference cells. Note that this embodiment is not limited to dedicated bit lines, dedicated source lines, and can be freely used in any array orientation. An example of how this could be applied to a dedicated bit line orientation is shown on FIG. 16. In this embodiment 1600, 1602 and 1604 comprise a reference string of three reference cells and the reference current supplied by this string will be about one third of the normal cell current. Bit lines 1642 and 1644 are dummy bit lines which have no connection and would only be left in for yield improvement purposes. Floating body SRAM cells 1610, 1612 and 1614 comprise a second string of reference cells. Cells 1606 and 1616 are normal floating body SRAM array cells (memory cells) and are provided for demonstrative purposes. Note that although FIG. 16 shows reference cells with three serial devices, the number of cells used is meant for exemplary purposes only and not meant to limit the scope of this invention. Those skilled in the art will understand that a plurality of floating body SRAM devices greater than three can be used within these reference strings.

A non-limiting method to set the devices in FIG. 15 and FIG. 16 to state 1, according to an embodiment of the present invention, involves using impact ionization on the floating body cells adjacent to the source and bit line signals. This can be implemented as described in previous embodiments where high potentials such as but not limited to 0.8V, 1.0V, 1.2V or Vdd can independently be used on the drain 1520/1522, and gate 1524a, 1524b, 1524z while the source 1528 would be drive to a lower potential. This set of bias conditions would cause impact ionization to set device 1500a to state 1. The device 1500z connected to the source 1528 could be set by reversing the biases just described and placing a high potential on the source 1528 while using a low potential on the bit line 1520 or 1522. Interior cells such as 1500b, could be set using impact ionization by setting the unselected cell word lines to a high enough potential such that the transistor body effect will not limit the voltage passed to the drain of device 1500b and other subsequent interior devices. For example 1524a could be set to 2.0V, while the bit line 1520 could be set to a voltage such as 1.0V. Assuming the Vt of the transistor is less than 0.5V, the full 1.0V would be passed from the bit line 1520 to the drain of device 1500b. Normal gate conditions to induce impaction ionization such as 0.8V, 1.0V, 1.2V or Vdd can be used on the gate of internal reference cells. Note that this example is for demonstrative purposes only and not meant to limit this invention, other methods to set the floating body SRAM cells to state 1 are available which include but are not limited to: gate coupling; DNWell to floating body p-n junction breakdown; source to floating body p-n junction breakdown; and drain to floating body p-n junction breakdown.

The above embodiments were all presented for electrically floating body transistors fabricated on bulk silicon comprising of buried well region (electrically connected to the DNWell terminal). However this invention and all of the above embodiments may also be applied to other floating body memory cell technologies such as that fabricated on silicon on insulator (SOI) substrate, for example as described by Tack, Okhonin, and Ohsawa. In the case of the floating body memory cell fabricated on SOI, the DNWell implant may not be available and the SOI floating body memory cell may not be bi-stable with two stables states. Instead the SOI floating body memory cell may decay similar to a capacitor like that of a DRAM cell. However this invention would still provide a reliable reference cell that could track process, temperature, and voltage variations.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A method of tracking the state of a floating body memory cell for turning on and off a vertical bipolar holding mechanism to ensure that a state of the floating body memory cell is maintained, said method comprising:
   providing a reference cell that measures a potential level of the floating body of the floating body memory cell;
   providing a high level floating body potential detector and a low level floating body potential detector;
   inputting the potential level of the floating body to the high and low level floating body potential detectors;
   receiving output signals from the high and low level floating body potential detector by a controller; and
   controlling a voltage regulator to control a voltage level input to a source line, bit line or DNWell line of the floating body memory cell to turn off or turn on the vertical bipolar holding mechanism based upon input signals received from the high level floating body potential detector and the low level floating body potential detector.

2. The method of claim 1,
   wherein when the low level floating body potential detector inputs a signal to the controller indicating that a predetermined low potential has been measured, said controller controls said voltage regulator to increase the voltage level input to the source line or bit line to turn on the vertical bipolar holding mechanism; and
   wherein when the high level floating body potential detector inputs a signal to the controller indicating that a predetermined high potential has been measured, said controller controls said voltage regulator to turn off the voltage level input to the source line or bit line to turn off the vertical bipolar holding mechanism.

3. The method of claim 1,
   wherein when the low level floating body potential detector inputs a signal to the controller indicating that a predetermined low potential has been measured, said controller controls said voltage regulator to turn off the voltage level input to the DNWell line to turn on the vertical bipolar holding mechanism; and
   wherein when the high level floating body potential detector inputs a signal to the controller indicating that a predetermined high potential has been measured, said controller controls said voltage regulator to increase the voltage level input to the DNWell line to turn off the vertical bipolar holding mechanism.

4. The method of claim 3, further comprising:
   providing a plurality of said DNWell lines, source lines or bit lines;
   connecting said plurality of DNWell lines, source lines or bit lines with a plurality of equalization transistors;
   inputting a signal to said plurality of equalization transistors to turn on said equalization transistors to equalize charge among said plurality of said DNWell lines, source lines or bit lines, prior to said controlling said voltage regulator; and turning off said equalization transistors prior to said controlling said voltage regulator.

* * * * *